United States Patent
Park et al.

(10) Patent No.: US 10,706,929 B2
(45) Date of Patent: Jul. 7, 2020

(54) MEMORY DEVICE AND METHOD OF OPERATING THE SAME

(71) Applicant: SK hynix Inc., Icheon-si, Gyeonggi-do (KR)

(72) Inventors: Hee Joung Park, Seoul (KR); Kyeong Seung Kang, Suwon-si (KR); Won Chul Shin, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/933,979

(22) Filed: Mar. 23, 2018

(65) Prior Publication Data

US 2019/0043584 A1 Feb. 7, 2019

(30) Foreign Application Priority Data

Aug. 1, 2017 (KR) .................. 10-2017-0097830

(51) Int. Cl.
| | |
|---|---|
| *G11C 16/04* | (2006.01) |
| *G11C 16/26* | (2006.01) |
| *G11C 16/24* | (2006.01) |
| *G11C 11/56* | (2006.01) |
| *G11C 16/08* | (2006.01) |

(52) U.S. Cl.
CPC ...... *G11C 16/0483* (2013.01); *G11C 11/5642* (2013.01); *G11C 11/5671* (2013.01); *G11C 16/24* (2013.01); *G11C 16/26* (2013.01); *G11C 16/08* (2013.01); *G11C 2211/563* (2013.01); *G11C 2211/5642* (2013.01); *G11C 2211/5647* (2013.01)

(58) Field of Classification Search
CPC ............ G11C 16/0483; G11C 11/5642; G11C 11/5671; G11C 16/24
USPC ...................................... 365/189.12
See application file for complete search history.

(56) References Cited

U.S. PATENT DOCUMENTS

| | | | | |
|---|---|---|---|---|
| 2003/0214853 | A1* | 11/2003 | Hosono | G11C 16/3454 365/200 |
| 2005/0057995 | A1* | 3/2005 | Mitani | G11C 8/10 365/222 |
| 2011/0149652 | A1* | 6/2011 | Lee | G11C 11/5628 365/185.11 |

FOREIGN PATENT DOCUMENTS

| | | |
|---|---|---|
| KR | 1020100101896 A | 9/2010 |
| KR | 1020160075064 A | 6/2016 |
| KR | 1020180123610 A | 11/2018 |

* cited by examiner

*Primary Examiner* — Anthan Tran
(74) *Attorney, Agent, or Firm* — William Park & Associates Ltd.

(57) ABSTRACT

Presented herein is a memory device and a method of operating the memory device. The memory device may include a memory cell, and a page buffer coupled to the memory cell via a bit line and configured to perform a read operation on the memory cell. The page buffer may include a storage unit configured to control a bit line precharge operation during the read operation and to store a result value of a first sensing operation. After the bit line precharge operation, a value stored in the storage unit is inverted before the storage unit stores the result value of the first sensing operation.

8 Claims, 17 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2017-0097830 filed on Aug. 1, 2017, in the Korean Intellectual Property Office, the entire disclosure of which is incorporated herein by reference.

BACKGROUND

1. Technical Field

Various embodiments of the present disclosure generally relate to a memory device and a method of operating the memory device. More particularly, various embodiments of the present disclosure relate to reducing source line noise during a read operation of a memory device.

2. Related Art

A memory device may include a plurality of memory cells coupled in groups to multiple word lines. The plurality of memory cells may also be coupled in sets to page buffers through multiple bit lines. Each page buffer may be used to perform a read operation of sensing data stored in a set of memory cells, temporarily storing the data, and outputting the stored data.

The read operation may include one or more sensing operations. During the read operation, a sensing operation may be simultaneously performed on multiple memory cells of a group of memory cells coupled to a single word line. During the sensing operation on the memory cells, a relatively large amount of current may be consumed. Due to such high current consumption, noise may be generated from a source line of the memory device. The noise generated from the source line may occasionally cause an error in the sensing operation, thus reducing the reliability of the memory device.

SUMMARY

Various embodiments of the present disclosure are directed to a memory device having improved reliability. Additional embodiments of the present disclosure are directed to a method of operating the memory device having improved reliability.

An embodiment of the present disclosure is directed to a memory device including: a memory cell; a bit line coupled to the memory cell; and a page buffer coupled to the bit line, wherein the page buffer is configured to perform a read operation on the memory cell. The page buffer includes a storage unit configured to control a bit line precharge operation during the read operation and store a result value of a first sensing operation. After the bit line precharge operation, a value stored in the storage unit is inverted before the storage unit stores the result value of the first sensing operation.

For an embodiment, the page buffer is configured to perform a bit line recovery operation after the first sensing operation and a voltage of the bit line is determined based on the result value of the first sensing operation during the bit line recovery operation. In a further embodiment, the page buffer is configured to perform a second sensing operation after the bit line recovery operation and the storage unit is configured to store a result value of the second sensing operation. After the bit line recovery operation, a value stored in the storage unit is reset before the storage unit stores the result value of the second sensing operation. In a further embodiment, the memory device also includes a word line coupled to the memory cell and a row decoder coupled to the word line. The row decoder is configured to apply a first read voltage to the word line during the first sensing operation and to apply a second read voltage to the word line during the second sensing operation, wherein the second read voltage is greater than the first read voltage.

For another embodiment, the page buffer is configured to perform a bit line recovery operation after the first sensing operation. Also, the page buffer is configured to electrically connect the bit line to a ground node during the bit line recovery operation when the result value of the first sensing operation is "on-cell."

For another embodiment, the page buffer includes a sense node, wherein a voltage of the sense node is changed based on a threshold voltage of the memory cell, and the sense node is configured to float before the result value of the first sensing operation is stored. In a further embodiment, the read operation includes a sense evaluation operation, and the sense node is electrically disconnected from a power source node of the memory device during the sense evaluation operation.

For another embodiment, the storage unit includes a first output node coupled with an N-type MOS transistor, and the sense node is coupled to a gate node of the N-type MOS transistor. In a further embodiment, the page buffer includes a first transistor configured to control an electrical connection between a power source node of the memory device and the bit line, and the first output node is coupled to a gate node of the first transistor.

An embodiment of the present disclosure is directed to a memory device including: a plurality of memory cells; a plurality of bit lines coupled to the memory cells; and a plurality of page buffers coupled to the bit lines, wherein the page buffers are configured to perform a read operation on the memory cells. Each of the page buffers includes a storage unit configured to store a result value of a first sensing operation during the read operation. Each of the page buffers also includes a sense node. The sense node is configured to float after a voltage of the sense node is changed depending on a threshold voltage of the corresponding memory cell. Further, a value stored in the storage unit is changed based on the changed voltage of the sense node.

For an embodiment, the storage unit is configured to store a result value of a second sensing operation performed after the first sensing operation. In a further embodiment, the memory device also includes a word line coupled to the memory cells and a row decoder coupled to the word line. The row decoder is configured to apply a first read voltage to the word line during the first sensing operation and to apply a second read voltage to the word line during the second sensing operation, wherein the second read voltage is greater than the first read voltage. In another embodiment, the storage unit is configured to control a voltage of a bit line, of the plurality of bit lines, coupled to a page buffer, of the plurality of page buffers, that includes the storage unit.

For another embodiment, the storage unit includes a first output node coupled with an N-type MOS transistor, and the sense node is coupled to a gate node of the N-type MOS transistor. In a further embodiment, each of the page buffers includes a first transistor configured to control an electrical connection between a power source node of the memory device and the corresponding bit line, wherein the first output node is coupled to a gate node of the first transistor. In another embodiment, each of the page buffers includes a first transistor configured to control electrical connection between a ground node and the corresponding bit line, wherein the first output node is coupled to a gate node of the first transistor.

In accordance with the teachings of the present disclosure is a method of operating a memory device. The method includes changing a voltage of a sense node of a page buffer of the memory device based on a threshold voltage of a memory cell of the memory device and floating the sense node. The method also includes resetting a storage unit of the page buffer while the sense node floats. The method further includes controlling a value stored in the storage unit based on the voltage of the sense node and a bit line recovery operation of controlling a voltage of a bit line coupled to the memory cell based on the value stored in the storage unit.

In one embodiment, the bit line recovery operation includes changing a voltage of a word line coupled to the memory cell. In another embodiment, the bit line recovery operation includes electrically connecting the bit line to a ground node when the voltage of the sense node is at a low level. For a different embodiment, the value stored in the storage unit is inverted when the voltage of the sense node is at a high level.

DETAILED DESCRIPTION

Embodiments are described in detail below with reference to the accompanying drawings. Provided embodiments should not be construed as being limited to the descriptions and drawings as set forth herein. Those of ordinary skill in the art will appreciate that various modifications and changes can be made without departing from the scope of the teachings as set forth in the claims below. Accordingly, the specification and drawings are to be regarded in an illustrative rather than a restrictive sense, and all such modifications are intended to be included within the scope of present teachings.

It is also noted that in this specification, "connected/coupled" can refer to a first component being directly connected to a second component. "Connected/coupled" can also refer to the first and second components being indirectly coupled to one another through a third intermediate component. The words "directly connected/directly coupled" refer to the first component being directly connected to the second component without the third intermediate component being between the first and second components. Unless defined otherwise, "include/comprise" or "including/comprising" as used herein represents that one or more components, steps, operations, or elements are open with respect to the inclusion of additional components, steps, or elements.

Figure 1:
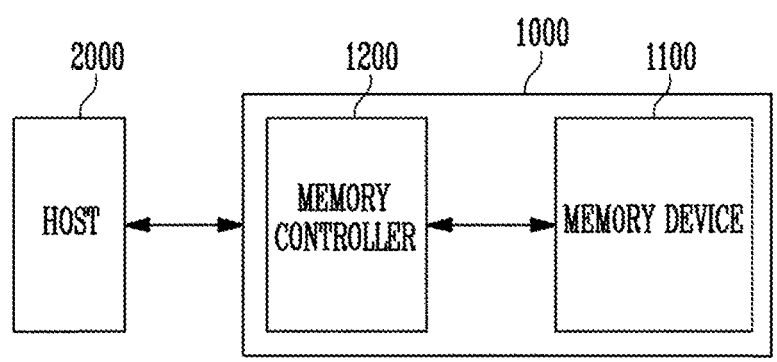
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a memory device 1100, configured to store data, and a controller 1200, configured to control the memory device 1100 under the control of a host 2000.

The host 2000 may communicate with the memory system 1000 using an interface protocol such as peripheral component interconnect-express (PCI-E), advanced technology attachment (ATA), serial ATA (SATA), parallel ATA (PATA), or a serial attached SCSI (SAS). The interface protocol used for the purpose of data communication between the host 2000 and the memory system 1000 is not limited to the foregoing examples. Other interface protocols can be used, which include but are not limited to universal serial bus (USB), multi-media card (MMC), enhanced small disk interface (ESDI), or integrated drive electronics (IDE).

The memory controller 1200 may control the overall operation of the memory system 1000 and the data exchange between the host 2000 and the memory device 1100. For instance, the memory controller 1200 may control the memory device 1100 to program or read data in response to a request from the host 2000. Furthermore, the memory controller 1200 may control the memory device 1100 such that information is stored in main memory blocks and sub-memory blocks included in the memory device 1100. A program operation may be performed on the main memory blocks or the sub-memory blocks depending on the amount of data loaded for the program operation. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), or a flash memory.

The memory device 1100 may execute a program and/or perform a read or erase operation under the control of the memory controller 1200.

Figure 2:
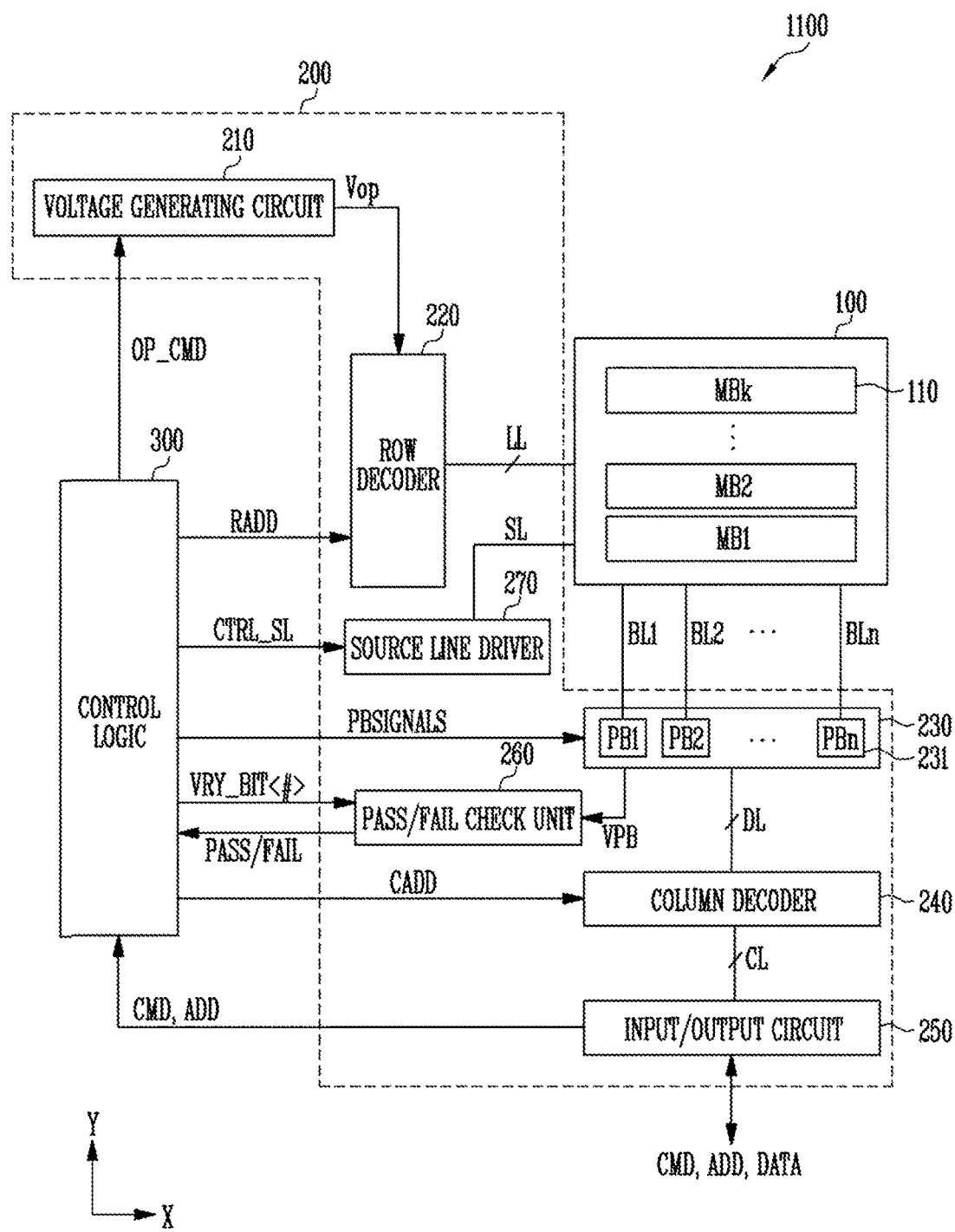
FIG. 2 is a diagram illustrating a memory device of FIG. 1.

FIG. 2 is a diagram illustrating the memory device 1100 of FIG. 1.

Referring to FIG. 2, the memory device 1100 may include a memory cell array 100 configured to store data. The memory device 1100 may also include peripheral circuits 200 configured to perform a program operation for storing data in the memory cell array 100, a read operation for outputting the stored data, and an erase operation for erasing the stored data. The memory device 1100 may further include a control logic circuit 300 configured to control the peripheral circuits 200 under the control of the memory controller (1200 of FIG. 1).

The memory cell array 100 may include a plurality of memory blocks MB1 to MBk 110 (k is a positive integer). Local lines LL and bit lines BL1 to BLn (n is a positive integer) may be coupled to each of the memory blocks MB1 to MBk 110. For example, the local lines LL may include a first select line, a second select line, and a plurality of word lines arranged between the first and second select lines. Furthermore, the local lines LL may include dummy lines arranged between the first select line and the word lines and between the second select line and the word lines. Here, the first select line may be a source select line, and the second select line may be a drain select line. For example, the local lines LL may include word lines, drain select lines, source select lines, and source line. The local lines LL may further include dummy lines and/or include pipelines. The local lines LL may be coupled to each of the memory blocks MB1 to MBk 110. The bit lines BL1 to BLn may be coupled in common to the memory blocks MB1 to MBk 110.

The memory blocks MB1 to MBk 110 may be embodied in a two- or three-dimensional structure. For example, with the memory blocks MB1 to MBk 110 having a two-dimensional structure, the memory cells may be arranged in a direction parallel to a substrate. With the memory blocks MB1 to MBk 110 having a three-dimensional structure, the memory cells may be stacked in a direction perpendicular to the substrate.

The peripheral circuits 200 may be configured to perform program, read, and erase operations on a selected memory block 110 under the control of the control logic circuit 300. For example, under the control of the control logic circuit 300, the peripheral circuits 200 may supply a verify voltage and pass voltages to the first select line, the second select line, and the word lines. The peripheral circuits 200 may also selectively discharge the first select line, the second select line, and the word lines. The peripheral circuits 200 may further verify memory cells coupled to a selected word line among the word lines. For instance, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop to be used for the program, read, and erase operations in response to an operating signal OP_CMD. Furthermore, the voltage generating circuit 210 may selectively discharge the local lines LL in response to the operating signal OP_CMD. For example, the voltage generating circuit 210 may generate a program voltage, a verify voltage, pass voltages, a turn-on voltage, a read voltage, an erase voltage, a source line voltage, and/or other voltages under the control of the control logic circuit 300.

The row decoder 220 may deliver operating voltages Vop to local lines LL coupled to a selected memory block 110 in response to a row address RADD.

The page buffer unit 230 may include a plurality of page buffers PB1 to PBn 231 coupled to the bit lines BL1 to BLn. The page buffers PB1 to PBn 231 may operate in response to page buffer control signals PBSIGNALS. For instance, the page buffers PB1 to PBn 231 may temporarily store data received through the bit lines BL1 to BLn or sense voltages or currents of the bit lines BL1 to BLn during a read or verify operation.

The column decoder 240 may transmit data between the input/output circuit 250 and the page buffer group 230 in response to a column address CADD. For example, the column decoder 240 may exchange data with the page buffers PB1 to PBn 231 through data lines DL or exchange data with the input/output circuit 250 through column lines CL.

The input/output circuit 250 may transmit a command CMD or an address ADD received from the memory controller (1200 of FIG. 1) to the control logic circuit 300, or exchange data DATA with the column decoder 240.

During the read or verify operation, the pass/fail check circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The source line driver 270 may be coupled with the memory cells included in the memory cell array 100 through the source line SL and configured to control the voltage of a source node. For example, the source line driver 270 may electrically couple the source node of a memory cell to a ground node during a read or verify operation. Furthermore, the source line driver 270 may apply a power voltage to the source node of the memory cell during a program operation. The source line driver 270 may float the source node of the memory cell during an erase operation. The source line driver 270 may receive a source line control signal CTRL_SL from the control logic circuit 300 and control the voltage of the source node based on the source line control signal CTRL_SL.

The control logic circuit 300 may output an operating signal OP_CMD, a row address RADD, page buffer control signals PBSIGNALS, and an enable bit VRY_BIT<#> in response to a command CMD and an address ADD and thus control the peripheral circuits 200. In addition, the control logic circuit 300 may determine whether target memory cells have passed or failed a verify operation in response to a pass or fail signal PASS or FAIL.

Figure 3:
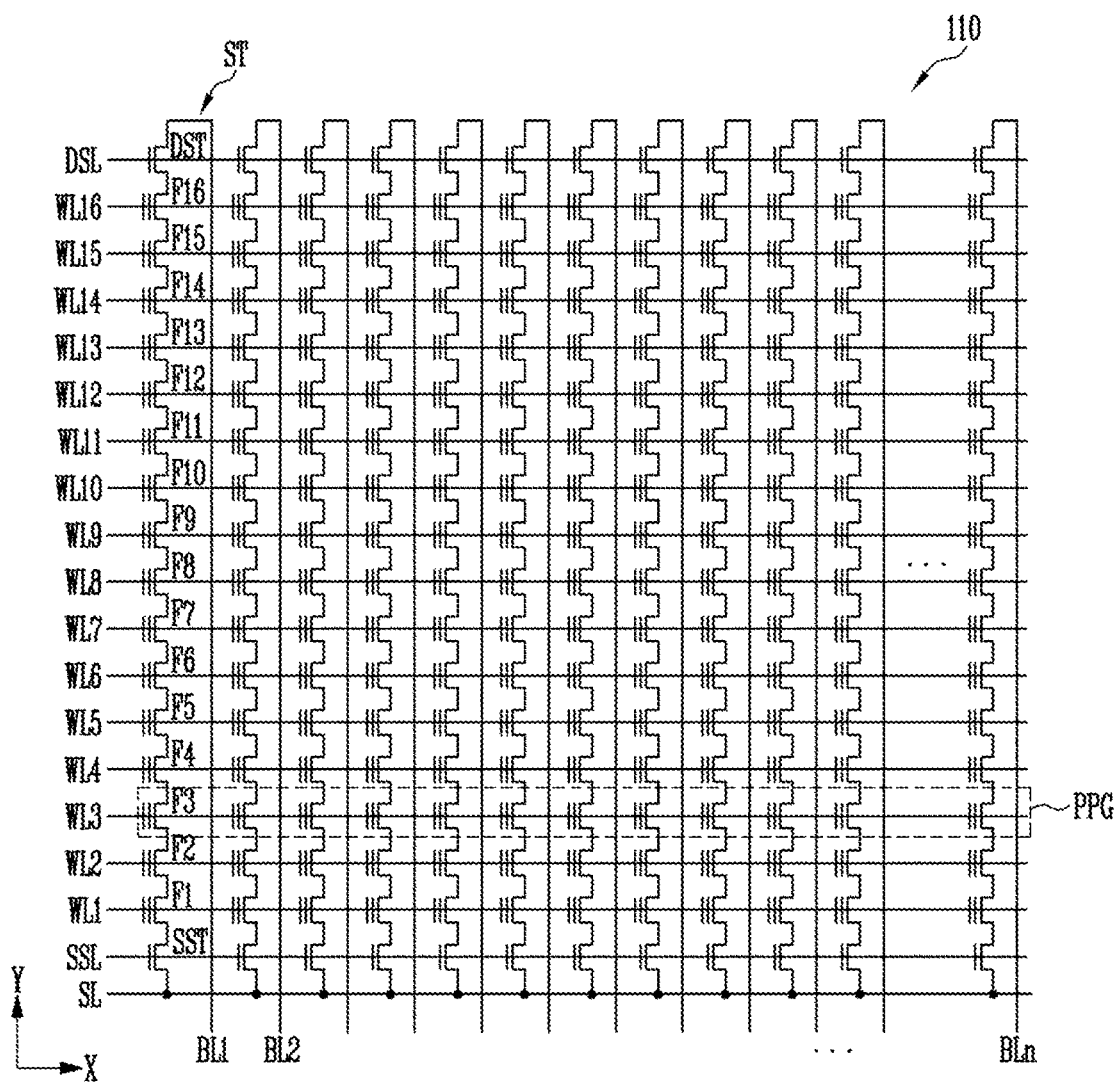
FIG. 3 is a diagram illustrating a memory block of FIG. 2.

FIG. 3 is a diagram illustrating a memory block 110 of FIG. 2.

Referring to FIG. 3, in the memory block 110, a plurality of word lines arranged parallel to each other may be coupled between a first select line and a second select line. Here, the first select line may be a source select line SSL, and the second select line may be a drain select line DSL. In more detail, the memory block 110 may include a plurality of strings ST coupled between the bit lines BL1 to BLn and the source line SL. The bit lines BL1 to BLn may be respectively coupled to the strings ST, and the source line SL may be coupled in common to the strings ST. The strings ST may all have the same configuration; therefore, only the string ST that is coupled to the first bit line BL1 will be described in detail, serving as an example for other strings ST.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST. Further, a larger number of memory cells than the number of memory cells F1 to F16 shown in FIG. 2 may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL. Gates of the drain select transistors DST may be coupled to the drain select line DSL. Further, gates of the memory cells F1 to F16 may be coupled to the plurality of word lines WL1 to WL16. Among the memory cells included in different strings ST, a group of memory cells coupled to the same word line may be referred to as a physical page PPG. Therefore, the number of physical pages PPG included in the memory block 110 may correspond to the number of word lines WL1 to WL16.

For some embodiments, each memory cell may store one bit of data. This type of memory cell is typically called a single-level cell SLC. In this case, each physical page PPG may store the data of a single logical page LPG. Data of each logical page LPG may include data bits corresponding to the number of cells included in a single physical page PPG. In other embodiments, each memory cell may store two or more bits of data. This type of memory cell is typically called a multi-level cell MLC. In this case, each physical page PPG may store the data of two or more logical pages LPG.

Figure 4:
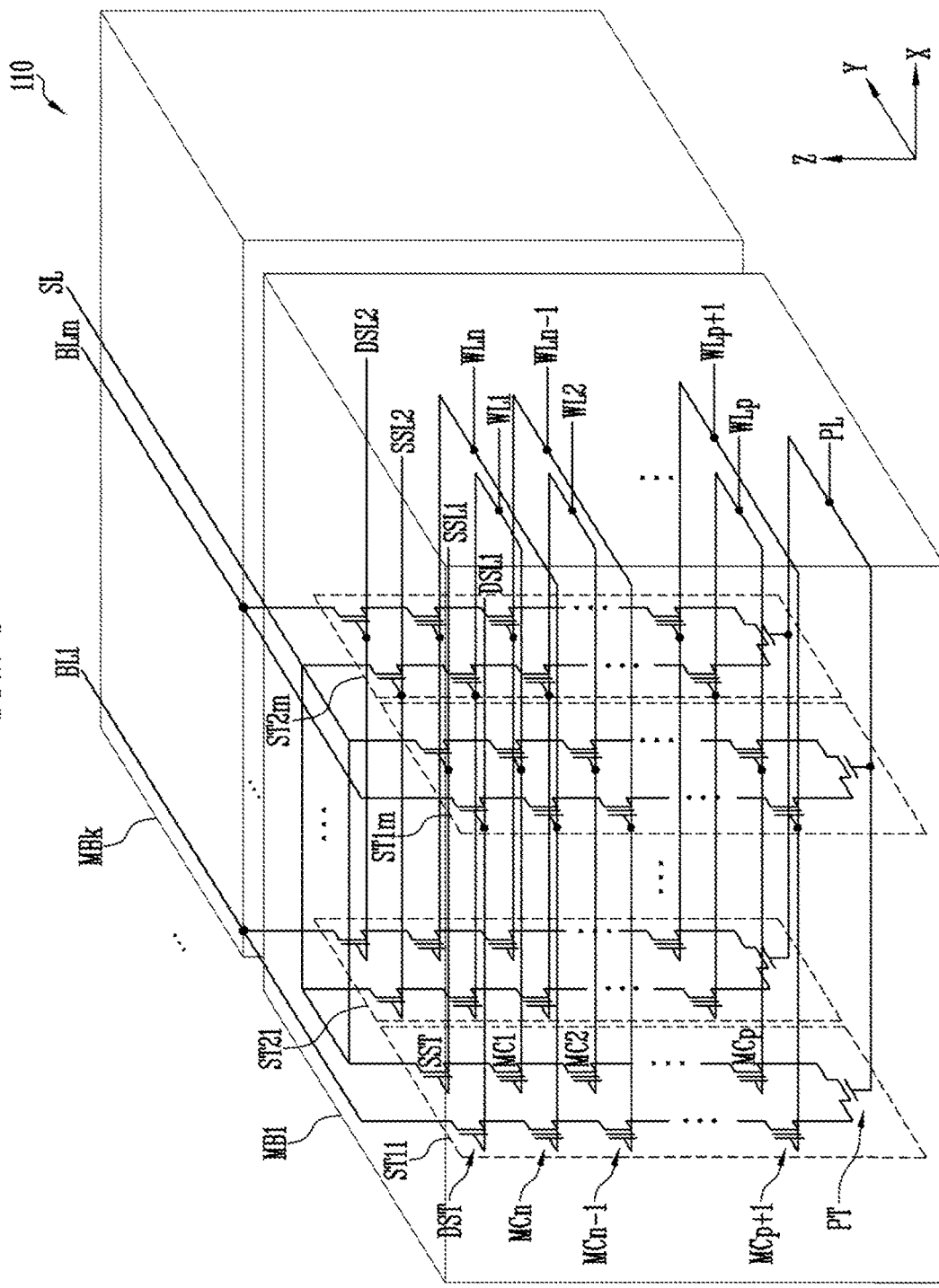
FIG. 4 is a diagram illustrating memory blocks having a three-dimensional structure in accordance with an embodiment of the present disclosure.

FIG. 4 is a diagram illustrating the memory blocks MB1 to MBk 110 having a three-dimensional structure in accordance with an embodiment of the present disclosure.

Referring to FIG. 4, the memory cell array 100 may include a plurality of memory blocks MB1 to MBk 110. Each memory block 110 may include a plurality of strings ST11 to ST1m and ST21 to ST2m. In an embodiment, each of the strings ST11 to ST1m and ST21 to ST2m may be formed in a 'U' shape. In the first memory block MB1, m strings may be arranged in a row direction (i.e. in an X direction). FIG. 4, illustrates an example in which two strings are arranged in a column direction (i.e., in a Y direction). In other embodiments, strings may be arranged differently. For example, three or more strings may be arranged in the column direction (the Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have structures similar to each other. For example, each of the source and drain select transistors SST and DST and the memory cells MC1 to MCn may include a channel layer, a tunnel insulating layer, a charge trap layer, and a blocking insulating layer. For instance, a pillar for providing the channel layer may be provided in each string. In an embodiment, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCp.

In an embodiment, source select transistors of strings arranged in the same row may be coupled to a source select line extending in the row direction. Source select transistors of strings arranged in different rows may be coupled to different source select lines. In FIG. 4, the source select transistors of the strings ST11 to ST1m in a first row may be coupled to a first source select line SSL1. The source select transistors of the strings ST21 to ST2m in a second row may be coupled to a second source select line SSL2.

In another embodiment, the source select transistors of the strings ST11 to ST1m and ST21 to ST2m may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to n-th memory cells MCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. The gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell. In the case where a dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 4, the strings ST11 and ST21 in a first column may be coupled to a first bit line BL1. The strings ST1m and ST2m in an m-th column may be coupled to an m-th bit line BLm.

Among the strings arranged in the column direction, memory cells coupled to the same word line may form one page. For example, memory cells coupled to the first word line WL1, among the strings ST11 to ST1m in the first row, may form a single page. Memory cells coupled to the first word line WL1, among the strings ST21 to ST2m in the second row, may form another single page. When any one of the drain select lines DSL1 and DSL2 is selected, strings arranged in a corresponding row may be selected. When any one of the word lines WL1 to WLn is selected, a corresponding page of the selected strings may be selected.

Figure 5:
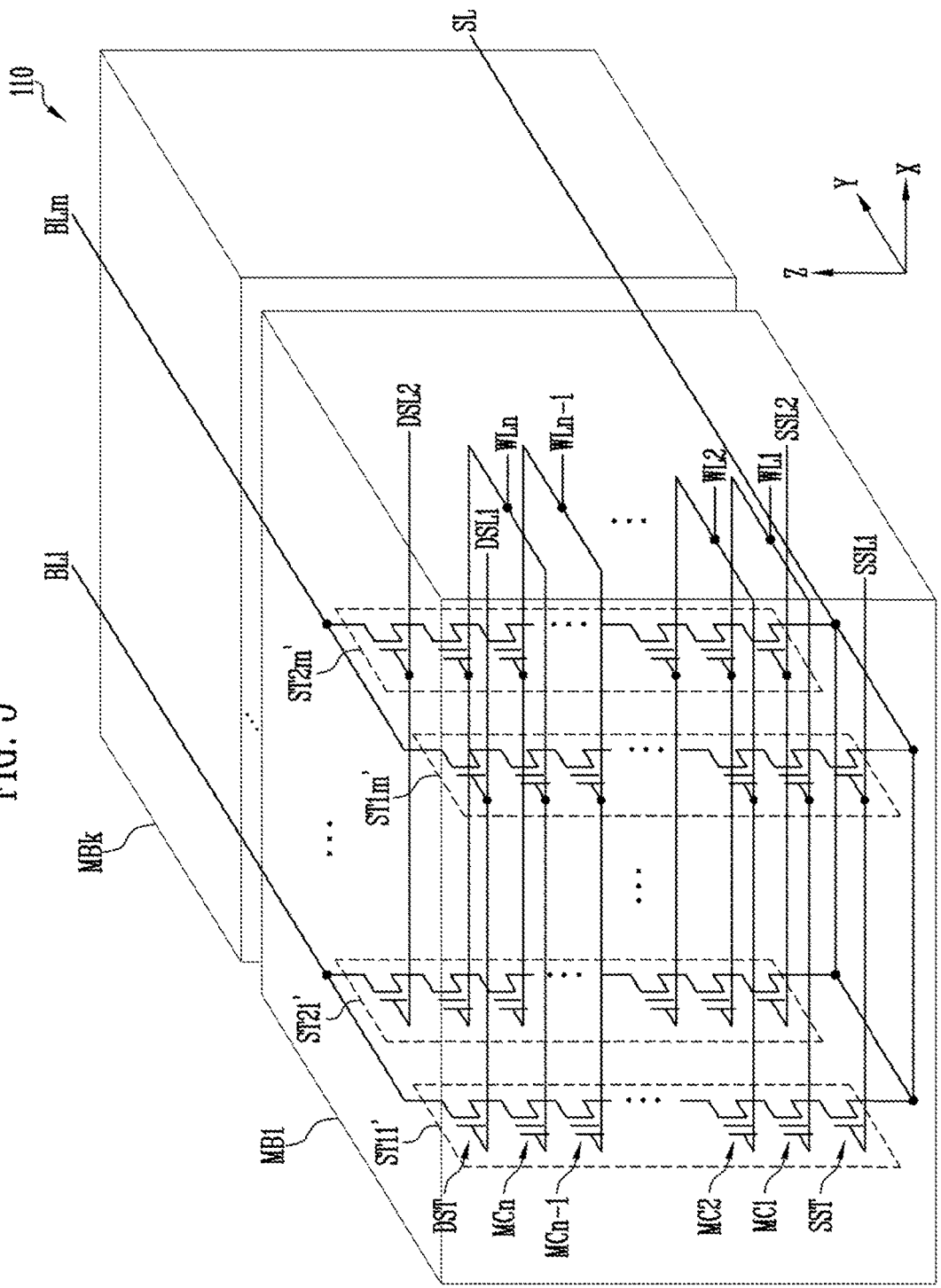
FIG. 5 is a diagram illustrating memory blocks having a three-dimensional structure in accordance with an embodiment of the present disclosure.

FIG. 5 is a diagram illustrating memory blocks MB1 to MBk 110 having a three-dimensional structure in accordance with an embodiment of the present disclosure.

Referring to FIG. 5, the memory cell array 100 may include a plurality of memory blocks MB1 to MBk 110. Each memory block 110 may include a plurality of strings ST11' to ST1m' and ST21' to ST2m'. Each of the strings ST11' to ST1m' and ST21' to ST2m' may extend in a vertical direction (i.e., in a Z direction). In each memory block 110, m strings may be arranged in a row direction (i.e., in an X direction). As illustrated in FIG. 5, two strings are arranged in a column direction (i.e., in a Y direction). This embodiment is provided for the sake of explanation. In other embodiments, three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to n-th memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where a dummy memory cell is provided, the voltage or current of the corresponding string may be stably controlled. Thereby, the reliability of data stored in each memory block 110 may be improved.

The drain select transistor DST of each string may be coupled between the corresponding bit line and the memory cells MC1 to MCn. Drain select transistors DST of strings arranged in the row direction may be coupled to corresponding drain select lines. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

In other words, the memory block 110 of FIG. 5 may have a circuit similar to that of the memory block 110 of FIG. 4 except that a pipe transistor PT is excluded from each cell string in FIG. 5.

Figure 6:
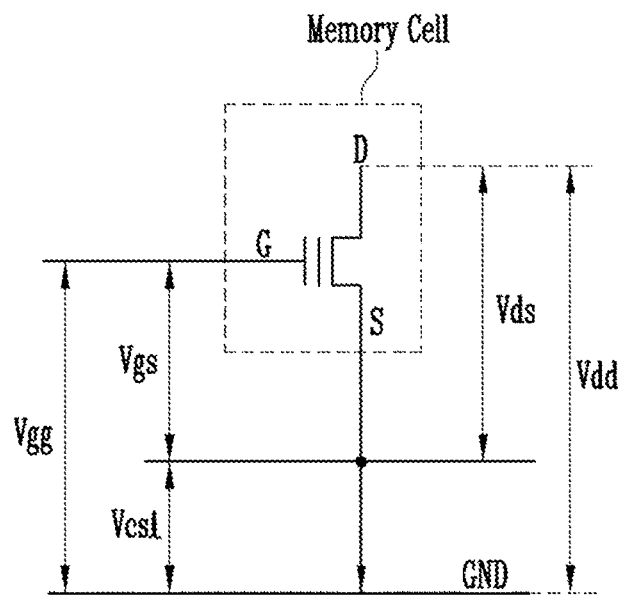
FIG. 6 is a diagram illustrating a threshold voltage disturbance phenomenon of a memory cell due to source line noise.

FIG. 6 is a diagram illustrating a threshold voltage disturbance phenomenon of a memory cell due to source line noise.

Referring to FIG. 6, a gate voltage Vgg may be applied to a gate G of a memory cell MC during a sensing operation. The gate voltage Vgg may be a voltage that is based on or measured relative to a ground voltage. During the sensing operation, current flowing through the memory cell may generate noise due to parasitic resistance while the current flows to a ground node via a source line driver 270 (for example, as shown in FIG. 2). In other words, during the sensing operation, the voltage of a source S of the memory cell may be at a voltage slightly higher than the ground voltage by an amount proportional to the current flowing through the memory cell (V=IR) given the parasitic resistance. Due to the presence of such source line noise during the sensing operation, a voltage difference Vgs between the gate G and the source S of the memory cell may be less than the gate voltage Vgg that is based on the ground voltage.

Because of the source line noise that is generated during the sensing operation, an actual voltage difference Vds between a drain D and the source S of the memory cell may be less than a drain voltage Vdd. Here, the drain voltage Vdd may be a voltage that is based on the ground voltage.

As described above, due to the source line noise occurring during the sensing operation, the voltage difference Vgs between the gate G and the source S of the memory cell and the voltage difference Vds between the drain D and the source S of the memory cell may be reduced as compared to the case where the voltage of the source node of the memory cell is equal to the ground voltage. As a result, the current flowing through the memory cell during the sensing operation may be reduced. This reduction in the current flowing through the memory cell during the sensing operation makes the threshold voltage of the memory cell seem higher than an actual value. The increase in the threshold voltage of the memory cell due to the source line noise may cause a malfunction in which the memory cell is sensed to be turned off even when the memory cell is turned on.

Figure 7:
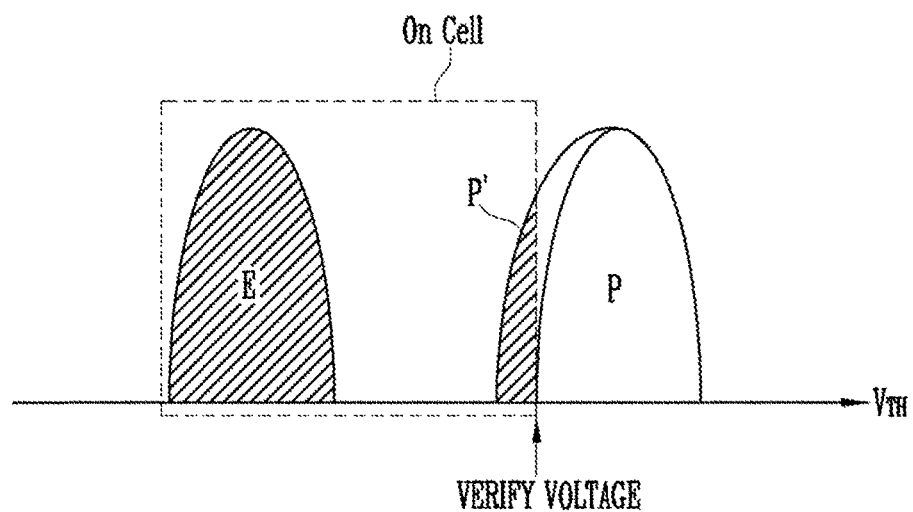
FIG. 7 is a diagram for explaining an error in a verify operation due to source line noise.

FIG. 7 is a diagram for explaining an error in a verify operation due to source line noise.

Referring to FIG. 7, a plurality of memory cells coupled to one word line may form an erase threshold voltage distribution E and a program threshold voltage distribution P by a program operation. In each memory cell, the threshold voltage is gradually increased from the erase threshold voltage distribution by a program pulse. As a result, when the threshold voltage is greater than a verify voltage, the memory cell passes the program operation. Consequently, memory cells that have passed the program operation may form the threshold voltage distribution P.

On a plurality of memory cells coupled to one word line, a verify operation may be simultaneously performed. In other words, a verify operation using a verify voltage V_verify may be simultaneously performed on memory cells that are in the erase threshold voltage distribution, memory cells that are in the program threshold voltage distribution, and memory cells P' that have not been completely programmed. During a bit line precharge operation and a sensing operation which are included in the verify operation, a large amount of current may flow through the memory cells that are in the erase threshold voltage distribution and the memory cells P' that have not been completely programmed. This current may generate noise on a source line of the memory cells. As described above, current flowing through a memory cell during the sensing operation may increase the voltage of the source node of the memory cell, thereby making the threshold voltage of the memory cell seem higher than an actual value. Here, a difference between the verify voltage and the threshold voltages of the memory cells that are in the erase threshold voltage distribution is greater than that of the memory cells P' that have not been completely programmed. Consequently, compared to the memory cells P' that have not been completely programmed, a larger amount of current may flow through the memory cells that are in the erase threshold voltage distribution. In other words, a part of the source line noise that arises from the memory cells that are in the erase threshold voltage distribution may be greater than that of the memory cells P' that have not been completely programmed. In addition, the source line noise may arise from memory cells for which the threshold voltage is less than the verify voltage. Therefore, the larger the number of memory cells having threshold voltages less than the verify voltage, the greater the source line noise. During the sensing operation included in the verify operation, due to the source line noise, the memory cells P' that have not been completely programmed may be determined to be turned off. As a result, the memory cells P' that have not been completely programmed may be determined to have passed the program operation.

Consequently, during the sensing operation included in the verify operation, due to the noise generated from the source line, memory cells having threshold voltages lower than the verify voltage may be determined to be turned off, whereby the program distribution may widen.

Figure 8:
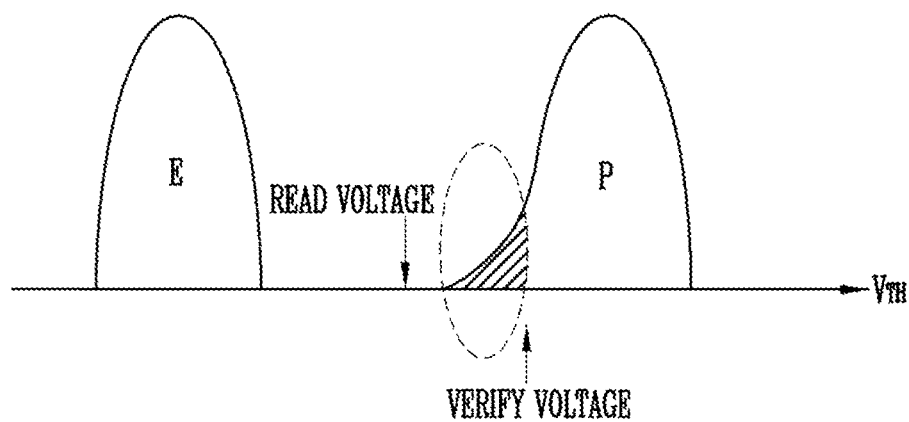
FIG. 8 is a diagram for explaining an error in a read operation due to source line noise.

FIG. 8 is a diagram for explaining an error in a read operation due to source line noise.

Referring to FIG. 8, it may be confirmed that a left portion of a program threshold voltage distribution has been widened by the source line noise generated during a verify operation. As the program threshold voltage distribution widens, a distance between a read voltage and the program threshold voltage distribution during the read operation may be reduced. As a result, a sensing margin of the read operation may be reduced, whereby an error in the read operation may be caused.

During the read operation, a large amount of current may flow through memory cells that are in an erase threshold voltage distribution. This current may generate noise on a source line of the memory cells The noise generated on the source line of the memory cells may make the threshold voltages of the memory cells that are included in the erase threshold voltage distribution seem to be higher. As a result, the sensing margin of the read operation may be further reduced. In other words, an error may be generated, in which some of the memory cells included in the erase threshold voltage distribution that should be determined to be turned on by the read operation are instead determined to be turned off due to the source line noise occurring during the read operation.

Figure 9:
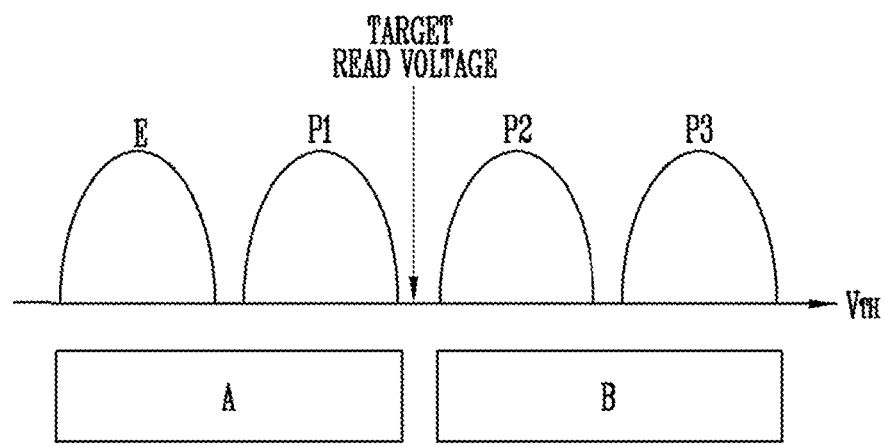
FIG. 9 is a diagram illustrating a read operation in accordance with an embodiment of the present disclosure.

FIG. 9 is a diagram illustrating a read operation in accordance with an embodiment of the present disclosure. Furthermore, FIG. 9 illustrates, as an example, a threshold voltage distribution of memory cells MC included in one physical page PPG in the case where 2-bit data is stored in one memory cell MC.

Referring to FIG. 9, the threshold voltage of each memory cell MC may be included in any one of an erase threshold voltage distribution E, a first program threshold voltage distribution P1, a second program threshold voltage distribution P2, and a third program threshold voltage distribution P3.

The memory device 1100 may perform a read operation through a sensing operation based on a target read voltage. The target read voltage may be a target threshold voltage based on a determination by the read operation of whether a memory cell is an on-cell or an off-cell. In other words, memory cells MC that are included in category A for which the threshold voltage is lower than the target read voltage may be determined to be on-cells by a sensing operation, so that '1' may be outputted as a data value. Memory cells MC that are included in category B for which the threshold voltage is higher than the target read voltage may be determined to be off-cells, so that '0' may be outputted as a data value. Furthermore, the target read voltage may be a voltage applied to a selected word line during a read operation.

The read operation may be a normal read operation in which data that has been programmed in the memory cells MC is read and outputted. In addition, the read operation may be a program verification read operation or an erase verification read operation.

When the read operation is performed using the target read voltage, current may flow through memory cells that are included in the erase threshold voltage distribution E or the first program threshold voltage distribution P1, in other words, through memory cells that are included in category A. Due to this current, noise may be generated from the source line. The source line noise may cause an error in the read operation, as described above. On the other hand, during the read operation, no current or only a small amount of current may flow through the memory cells that are included in category B, so that no source line noise or only a very small amount of source line noise may be caused.

Figure 10:
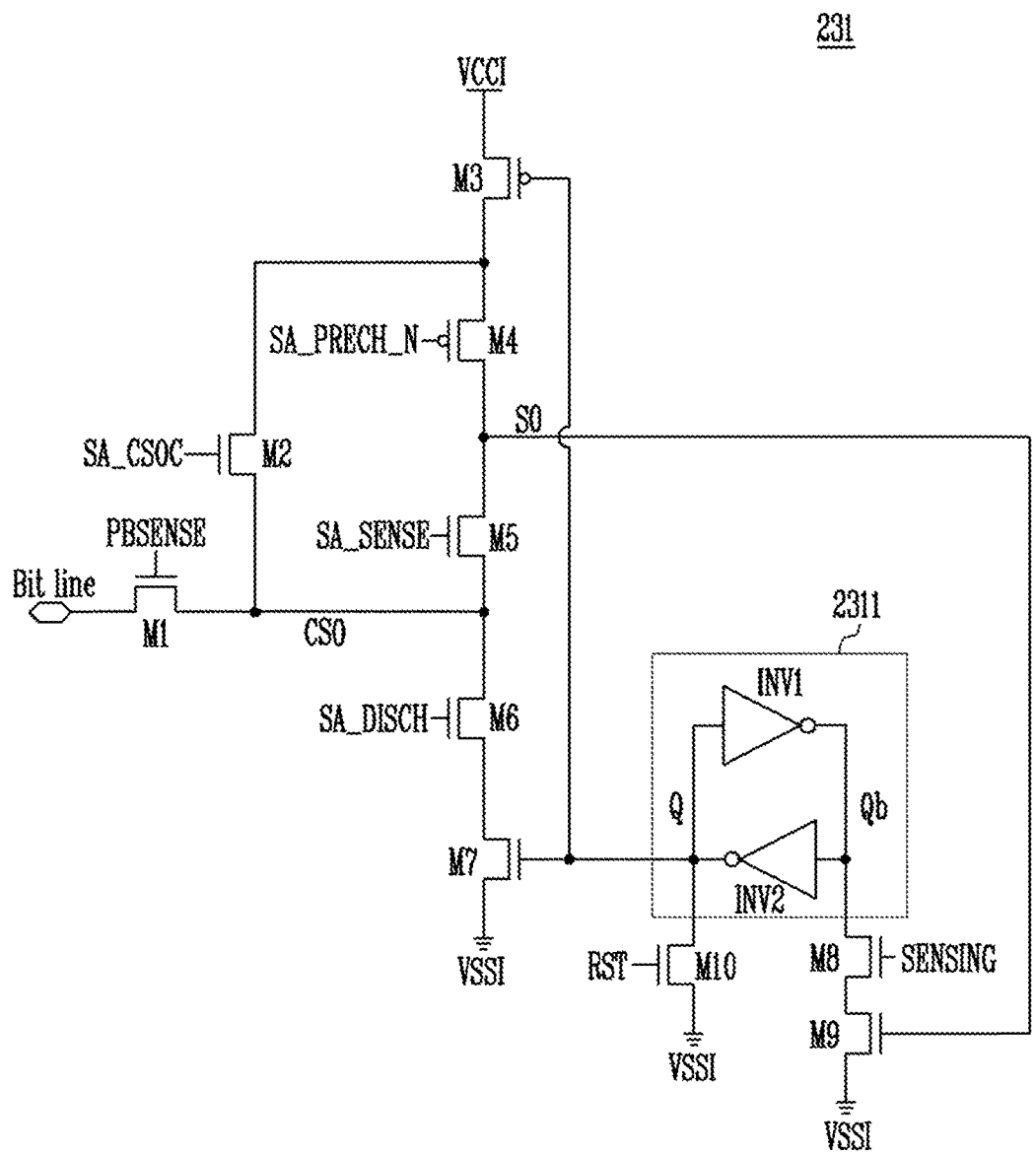
FIG. 10 is a diagram illustrating a page buffer in accordance with an embodiment of the present disclosure.
Figure 11:
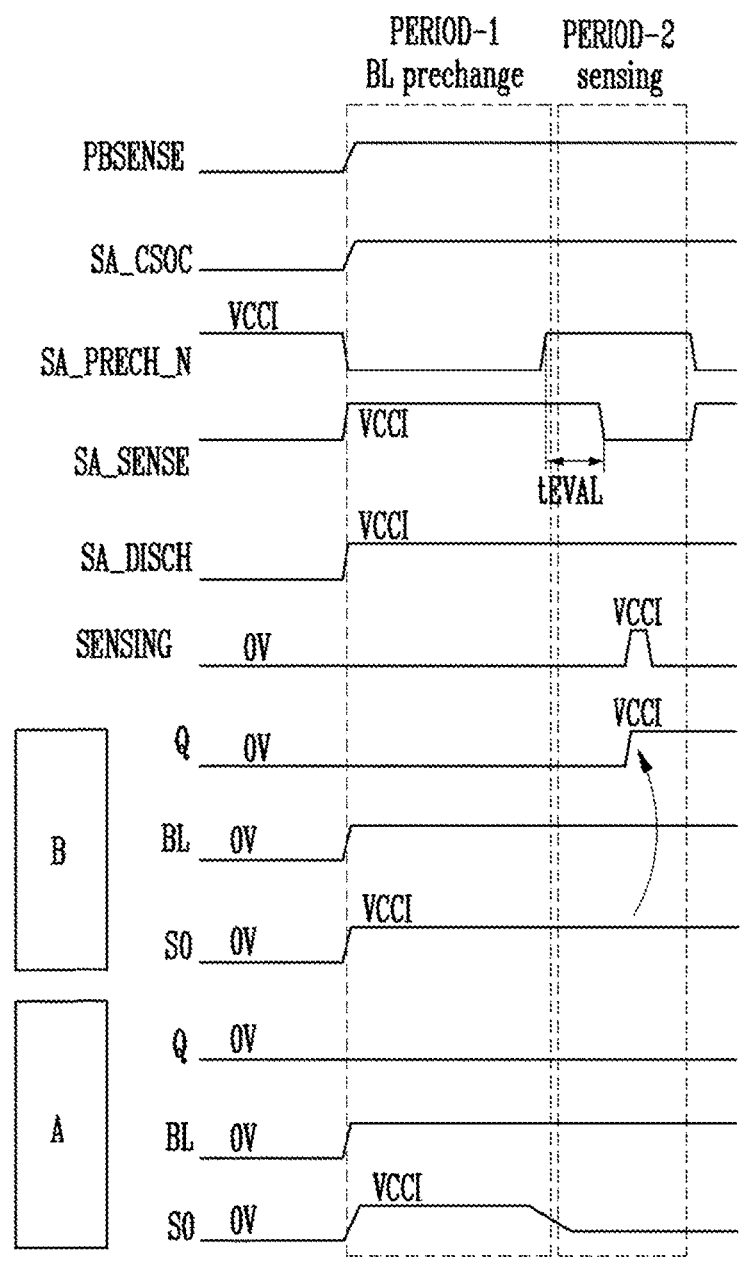
FIG. 11 is a timing diagram illustrating the operation of the page buffer of FIG. 10 during the read operation shown in FIG. 9.

FIG. 10 is a diagram illustrating a page buffer 231 in accordance with an embodiment of the present disclosure. FIG. 11 is a timing diagram illustrating the operation of the page buffer 231 of FIG. 10 during the read operation shown in FIG. 9.

Referring to FIG. 10, the page buffer 231 may be coupled to a memory cell MC through a bit line and perform a bit line precharge operation of charging charges from a power source VCCI to the bit line through first to fifth transistors M1 to M5. The first transistor M1 may be controlled by a first sense signal PBSENSE, the second transistor M2 may be controlled by a first precharge signal SA_CSOC, and the third transistor M3 may be controlled by a storage unit 2311. The fourth transistor M4 may be controlled by a second precharge signal SA_PRECH_N, and the fifth transistor M5 may be controlled by a second sense signal SA_SENSE. The storage unit 2311 may be formed of a latch or a fuse.

The page buffer 231 may discharge charges from the bit line to a ground voltage VSSI through the first transistor M1, a sixth transistor M6, and a seventh transistor M7. The sixth transistor M6 may be controlled by a first discharge signal SA_DISCH, and the seventh transistor M7 may be controlled by the storage unit 2311.

The page buffer 231 may include the storage unit 2311 having a first inverter INV1 and a second inverter INV2. The storage unit 2311 may control the bit line precharge operation by turning on or off the third transistor M3 through a Q node (Q). A Q-bar node (Qb) and the Q node (Q) may have values inverted from each other. During the sensing operation on the memory cell MC, the voltage of a sense-out node SO may be determined based on the threshold voltage of the memory cell MC. The storage unit 2311 may store a result of sensing the threshold voltage of the memory cell MC through a ninth transistor M9 coupled to the sense-out node SO. For an embodiment, the ninth transistor M9 may be an N-type MOS transistor. The sense-out node SO may be coupled to a gate node of the ninth transistor M9. Therefore, in the case where the threshold voltage of the memory cell MC is low, during the sensing operation, the sense-out node SO may be turned to a low level, and the ninth transistor M9 may be turned off. In the case where the threshold voltage of the memory cell MC is high, during the sensing operation, the sense-out node SO may be turned to a high level, and the ninth transistor M9 may be turned on.

For various embodiments, the low level and the high level of the sense-out node SO are low and high voltage levels, as measured relative to one another, of the sense-out node SO. The low-level voltage of the sense-out node SO, for example, corresponds to a first voltage which is less than a second voltage corresponding to the high-level voltage of the sense-out node SO.

Referring to FIG. 11, the read operation of the memory device 1100 may include a bit line precharge operation and a sensing operation performed after the bit line precharge operation.

Before the bit line precharge operation starts, a tenth transistor M10 may be turned on for a short time. The tenth transistor M10 may be controlled by a reset signal RST. Consequently, the Q node (Q) is set to a low level. During the bit line precharge operation, each of the first, second, third, fourth and fifth transistors M1, M2, M3, M4 and M5 is turned on and controlled to allow current to flow therethrough. Through a current path formed in the above-mentioned manner, current may be supplied from the power source VCCI to the bit line and the memory cell MC coupled to the bit line. Here, because the memory cells, for which the threshold voltage is included in category A of FIG. 9, are turned on, current is allowed to flow through the memory cells that are included in category A. Because the memory cells for which the threshold voltage is included in category B of FIG. 9 are turned off, current is not allowed to flow through the memory cells that are included in category B. During the bit line precharge operation, the sense-out node SO may be maintained at the power source voltage VCCI because the third transistor M3 and the fourth transistor M4 are turned on.

After the bit line precharge operation has been performed for a predetermined time, the fourth transistor M4 is turned off and the sensing operation starts. When the fourth transistor M4 is turned off, the sense-out node SO is electrically disconnected from the power source (VCCI) node. Here, charges that have been charged to the sense-out node SO of the page buffer 231 coupled to the memory cells for which the threshold voltage is included in category A of FIG. 9 may be discharged to the bit line during a sense evaluation period tEVAL through the current path formed via the first transistor M1 and the fifth transistor M5. Hence, the voltage of the sense-out node SO may be reduced to a level at which the ninth transistor M9 cannot be turned on. For the page buffer 231 coupled to the memory cells for which the threshold voltage is included in category B of FIG. 9, during the sense evaluation period tEVAL, charges that have been charged to the sense-out node SO are not discharged to the bit line. Hence, the voltage of the sense-out node SO may remain at the power source voltage VCCI or be only slightly reduced and set to a voltage at which the ninth transistor M9 can be turned on. In other words, during the sense evaluation period tEVAL, the voltage of the sense-out node SO may be determined by the threshold voltage of the memory cell. The higher the threshold voltage of the memory cell, the higher the voltage at which the sense-out node SO remains. The lower the threshold voltage of the memory cell, the lower the voltage of the sense-out node SO.

When the fifth transistor M5 is turned off, the sense evaluation period tEVAL is closed, and the electrical connection between the sense-out node SO and the bit line is interrupted. The sense-out node SO may remain at a voltage formed when the sense evaluation period tEVAL is closed, regardless of the threshold voltage of the memory cell. Thereafter, for a short time, a first sensing latch signal SENSING is activated. As a result, the eighth transistor M8 is turned on. Here, in the case of the page buffer 231 coupled to the memory cells for which the threshold voltage is included in category A of FIG. 9, the ninth transistor M9 is not turned on by a voltage drop of the sense-out node SO, and the storage unit 2311 including the first inverter INV1 and the second inverter INV2 remains at an existing stored value. In other words, the Q node (Q) remains at a low level during the bit line precharge operation. In the case of the page buffer 231 coupled to the memory cells for which the threshold voltage is included in category B of FIG. 9, the eighth transistor M8 is turned on, and the voltage stored in the storage unit 2311 is inverted. In other words, the Q node (Q) is inverted from the low level to the high level.

During the sensing operation, current flows through the memory cells included in category A of FIG. 9, and noise may be generated from the source line of the memory cells by this current. In other words, the larger the number of cells included in category A, the higher the probability of an occurrence of an error in the read operation.

Figure 12:
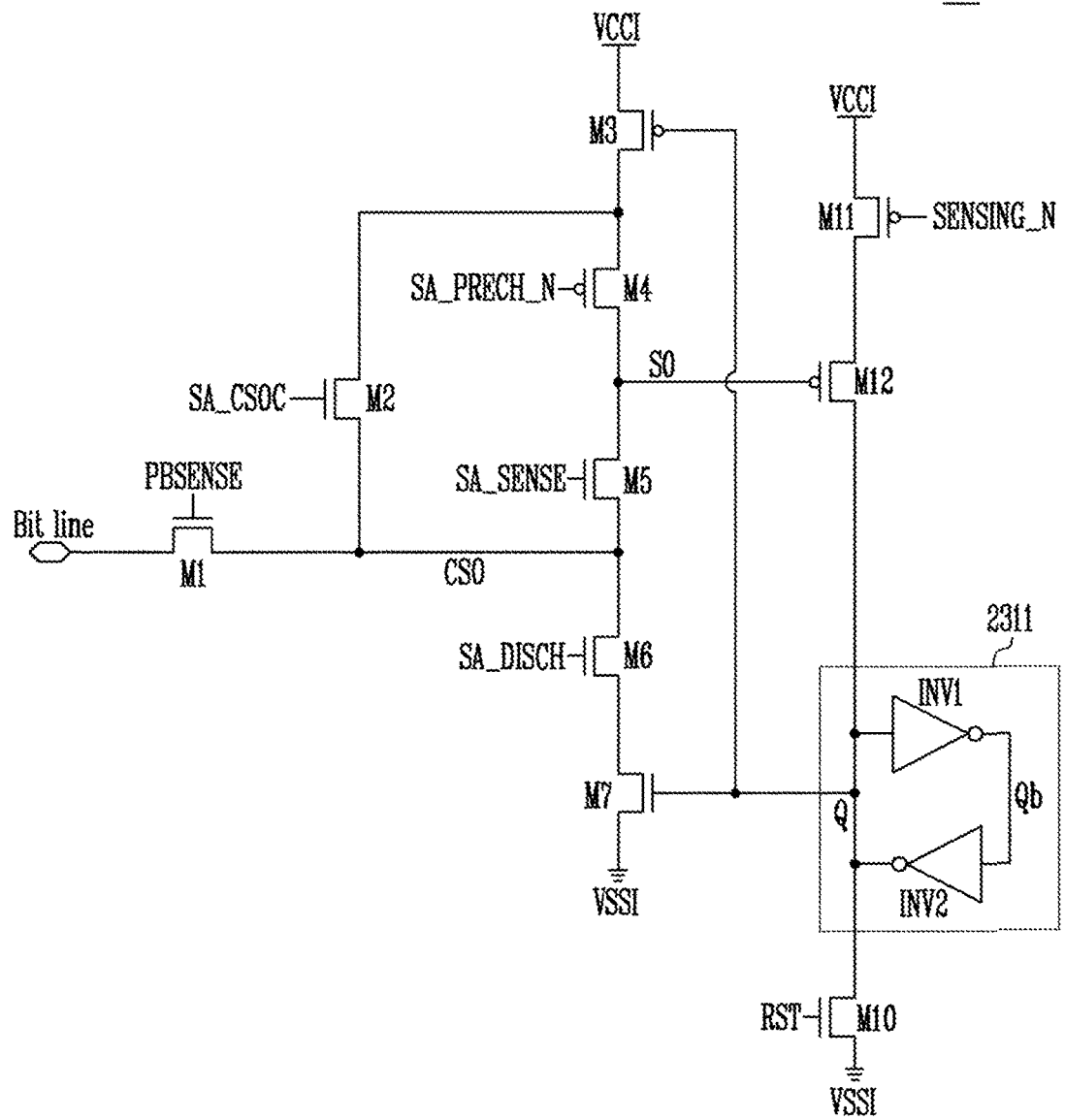
FIG. 12 is a diagram illustrating a page buffer in accordance with an embodiment of the present disclosure.
Figure 13:
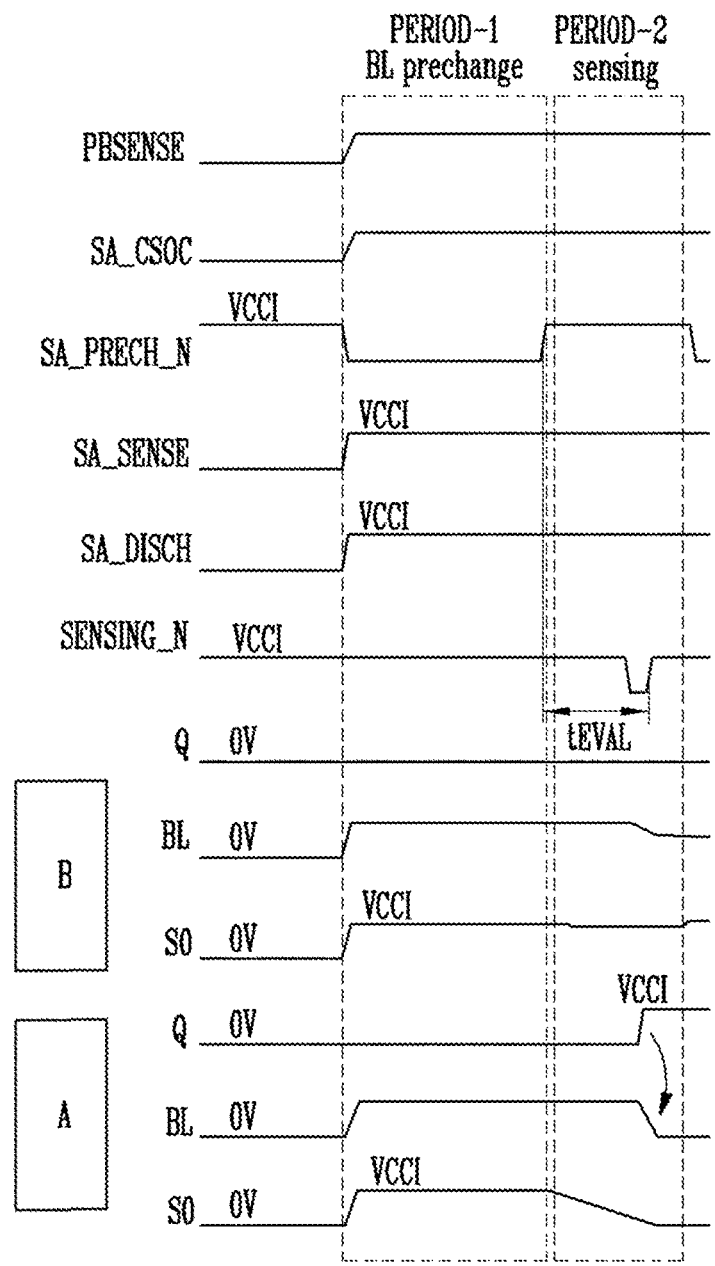
FIG. 13 is a timing diagram illustrating the operation of the page buffer of FIG. 12 during the read operation shown in FIG. 9.

FIG. 12 is a diagram illustrating the page buffer 231 in accordance with another embodiment of the present disclosure. FIG. 13 is a timing diagram illustrating the operation of the page buffer 231 of FIG. 12 during the read operation shown in FIG. 9.

Referring to FIG. 12, the page buffer 231 may be coupled to a memory cell MC through a bit line Bit line and perform a bit line precharge operation of charging charges from a power source VCCI to the bit line through first to fifth transistors M1 to M5. The first transistor M1 may be controlled by a first sense signal PBSENSE, the second transistor M2 may be controlled by a first precharge signal SA_CSOC, and the third transistor M3 may be controlled by a storage unit 2311. The fourth transistor M4 may be controlled by a second precharge signal SA_PRECH_N, and the fifth transistor M5 may be controlled by a second sense signal SA_SENSE.

The page buffer 231 may discharge charges from the bit line to a ground VSSI through the first transistor M1, a sixth transistor M6, and a seventh transistor M7. The sixth transistor M6 may be controlled by a first discharge signal SA_DISCH, and the seventh transistor M7 may be controlled by the storage unit 2311.

The page buffer 231 may be coupled to the memory cell MC through the bit line and perform the bit line precharge operation of supplying charges from the power source VCCI to the bit line through the first to fifth transistors M1 to M5. The page buffer 231 may discharge charges from the bit line to the ground VSSI through the first transistor M1, the sixth transistor M6, and the seventh transistor M7.

The page buffer 231 may include the storage unit 2311 having a first inverter INV1 and a second inverter INV2. The storage unit 2311 may control the bit line precharge operation by turning on or off the third transistor M3 through a Q node (Q). During the sensing operation on the memory cell MC, the voltage of a sense-out node SO may be determined based on the threshold voltage of the memory cell MC. The storage unit 2311 may store a result of sensing the threshold voltage of the memory cell MC through a twelfth transistor M12 coupled to the sense-out node SO. Here, the twelfth transistor M12 may be an P-type MOS transistor. The sense-out node SO may be coupled to a gate node of the twelfth transistor M12. When the threshold voltage of the memory cell MC is low, the sense-out node SO may be turned to the low level during a sensing operation, thus turning on the twelfth transistor M12. When the threshold voltage of the memory cell MC is high, the sense-out node SO may be turned to the high level during a sensing operation, thus turning off the twelfth transistor M12.

In the embodiment illustrated by FIG. 13, the bit line precharge operation may be performed in a manner similar to that of FIG. 11. Furthermore, during the bit line precharge operation, a second sensing signal SENSING_N may remain at a high level.

After the bit line precharge operation has been performed, the fourth transistor M4 is turned off, and a sense evaluation period tEVAL starts. During the sense evaluation period tEVAL, the voltage of the sense-out node SO may be changed based on the threshold voltage of the memory cell MC. After a predetermined time has passed after the fourth transistor M4 has been turned off, an eleventh transistor M11 is turned on for a short time. Here, whether the twelfth transistor M12 is turned on or off is determined depending on the voltage of the sense-out node SO. The eleventh transistor M11 may be controlled by the second sensing signal SENSING_N.

After the bit line precharge operation has been performed, the fourth transistor M4 is turned off, and the sensing operation starts. In the case of the page buffer 231 being coupled to the memory cells for which the threshold voltage is included in category A of FIG. 9, the voltage of the sense-out node SO is reduced during the sense evaluation period tEVAL to a level at which the twelfth transistor M12 can be turned on. As a result, the value stored in the storage unit 2311 may be inverted. In the case of the page buffer 231 being coupled to the memory cells for which the threshold voltage is included in category B of FIG. 9, the voltage of the sense-out node SO may remain as it is during the sense evaluation period tEVAL or be slightly reduced so that it is maintained at a level at which the twelfth transistor M12 can be turned off. As a result, the value stored in the storage unit 2311 may remain at the existing value. The sense evaluation period tEVAL may include a time at which a turn-on period of the eleventh transistor M11 is closed.

During the sensing operation, current flows through the memory cells included in category A of FIG. 9, and noise may be generated from the source line of the memory cells by this current. In other words, the larger the number of cells included in category A, the higher the probability of an occurrence of an error in the read operation.

Figure 14:
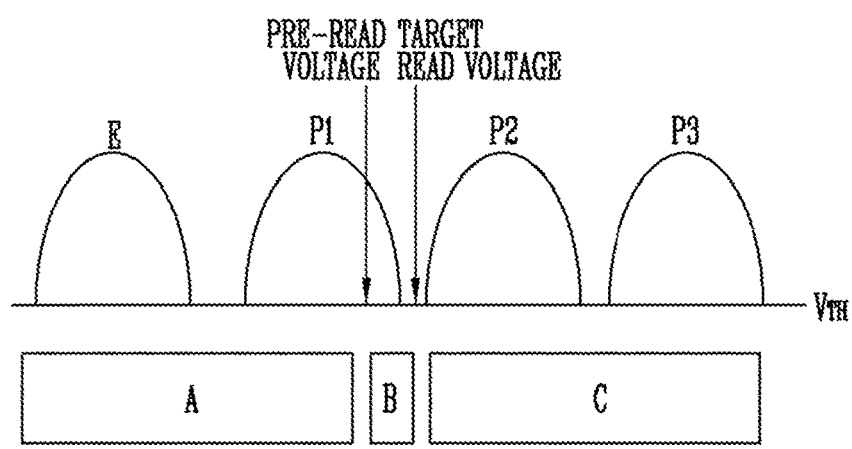
FIG. 14 is a diagram illustrating a read operation in accordance with an embodiment of the present disclosure.

FIG. 14 is a diagram illustrating a read operation in accordance with an embodiment of the present disclosure.

Referring to FIG. 14, each memory cell may store 2-bit data. In this case, a plurality of memory cells included in a single physical page may be included, after a program operation has been performed, in any one of an erase threshold voltage distribution E, a first program threshold voltage distribution P1, a second program threshold voltage distribution P2, and a third program threshold voltage distribution P3. In an embodiment, if each memory cell stores 3-bit data, the memory cell may be included in any one of an erase threshold voltage distribution and seven program threshold voltage distributions. Such an increase in the number of program threshold voltage distributions may reduce a sensing margin during the sensing operation, so that an increase in accuracy of the sensing operation may be required. Particularly, the above-mentioned threshold voltage disturbance of the memory cell due to the source line noise may be a main factor in reducing the sensing margin during the sensing operation. Therefore, to enhance the accuracy of the sensing operation, there is the need for reducing noise generated from the source line.

Referring to FIG. 14, the read operation may include a first sensing operation using a pre-read voltage, and a second sensing operation using a target read voltage. The pre-read voltage may be a voltage equal to or less than the target read voltage. The pre-read voltage and the target read voltage may be applied to a word line by the row decoder 220 of FIG. 2.

During the read operation, the first sensing operation (sensing-1) using the pre-read voltage may be performed before the second sensing operation using the target read voltage is performed. During the first sensing operation, the sensing operation may be performed on all memory cells that are present in a category A, a category B, and a category C illustrated by FIG. 14. In other words, during the first sensing operation, the bit line precharge operation may be performed on all bit lines that are coupled to memory cells in category A, category B, and category C, and current flowing through the memory cells may be sensed. Here, memory cells that are present in category A may be determined to be on-cells because current can flow through the memory cells because the pre-read voltage is higher than the threshold voltages of the memory cells. Furthermore, memory cells that are present in categories B or C may be determined to be off-cells because no current or only a small amount of current flows through the memory cells because the pre-read voltage is lower than the threshold voltages of the memory cells. In other words, the first sensing operation may function to enable the memory cells in category A and the memory cells in categories B or C to be distinguished from each other.

After the first sensing operation (sensing-1) has been completed, the second sensing operation (sensing-2) may be performed. During the second sensing operation using the target read voltage, the pre-charge operation may not be performed on the bit lines coupled to the memory cells in category A that have been determined to be on-cells during the first sensing operation. In other words, during the second sensing operation, the precharge operation may be performed on only the bit lines coupled to the memory cells in categories B or C that have been determined to be off-cells during the first sensing operation. In this case, current may not flow through the memory cells that are included in category A. In other words, source line noise may not occur due to the memory cells included in category A. During the second sensing operation, a small amount of current may flow through the memory cells included in category B. A difference between the target read voltage and the threshold voltages of the memory cells included in category B is less than that of the memory cells included in category A. Therefore, during the second sensing operation, current flowing through the memory cells included in category B is comparatively small, so that the source line noise caused by the memory cells included in category B may be relatively small. Furthermore, during the second sensing operation, the memory cells included in category C may be determined to be off-cells because no current or only a small amount of current flows through the memory cells. In other words, during the second sensing operation, no source line noise or only very small amount of source line noise may be caused by the memory cells included in category C. As a result, during the second sensing operation, the amount of source line noise may be very small. Consequently, a read error due to source line noise may be mitigated.

Category B may be set to a very small span of threshold voltages compared to the span of threshold voltages for category A. The smaller the span of category B, the more reduced the magnitude of source line noise generated during the second sensing operation may be.

After the read operation has been completed, data '1' may be outputted both for the memory cells in category A, that have been determined to be on-cells during the first sensing operation, and for the memory cells in category B, that have been determined to be on-cells during the second sensing operation. Furthermore, after the read operation has been completed, data '0' may be outputted for the memory cells in category C that have been determined to be off-cells during the second sensing operation. During the second sensing operation, the bit line precharge operation is not performed on the memory cells included in category A, so that the memory cells included in category A may be determined to be on-cells. In other words, data '1' may be outputted for the memory cells (in detail, the memory cells included in category A and the memory cells included in category B) determined to be on-cells during the second sensing operation. Data '0' may be outputted for the memory cells (in detail, the memory cells included in category C) determined to be off-cells during the second sensing operation.

Figure 15:
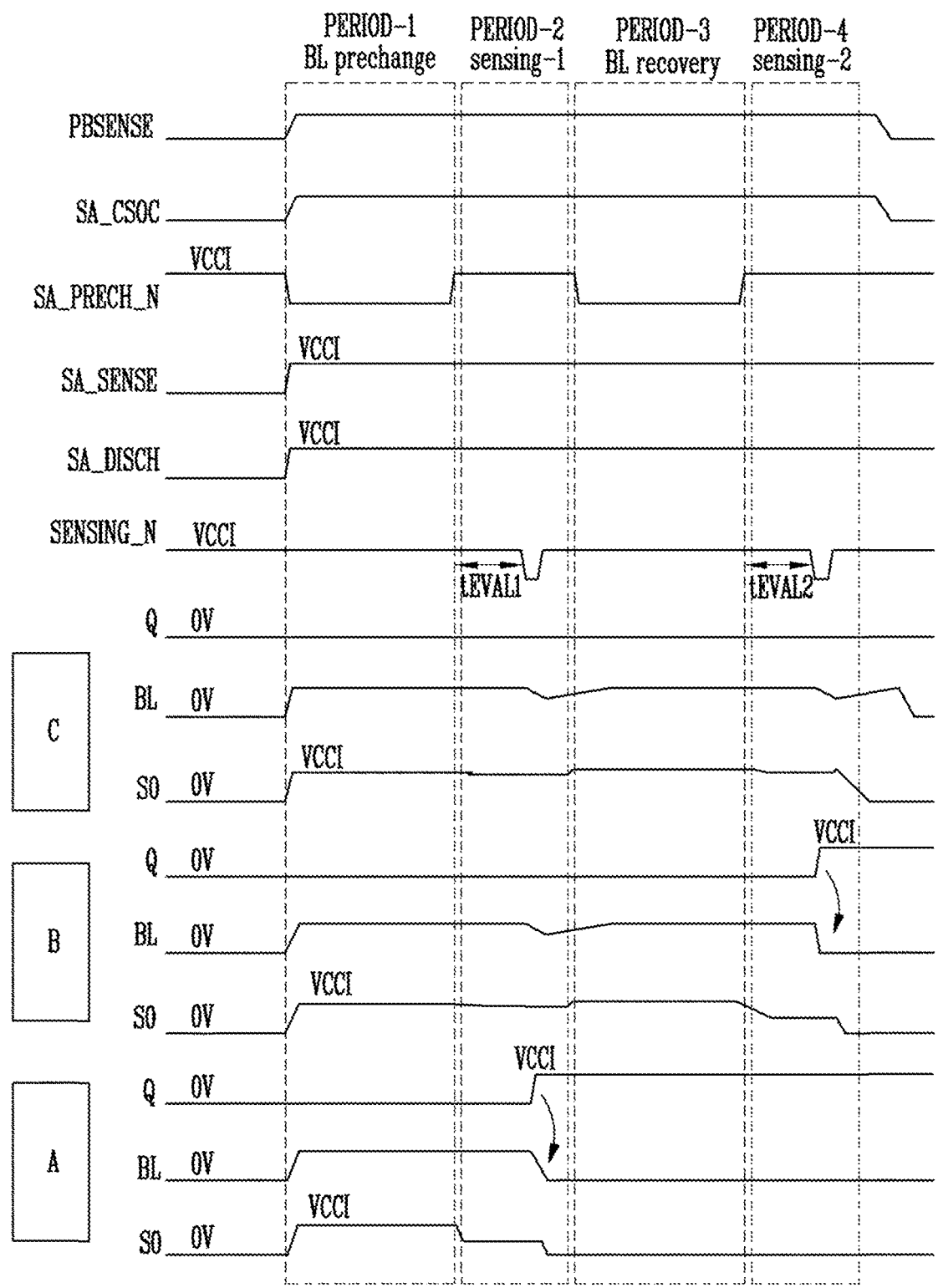
FIG. 15 is a timing diagram illustrating the operation of the page buffer of FIG. 12 during the read operation shown in FIG. 14.

FIG. 15 is a timing diagram illustrating the operation of the page buffer 231 of FIG. 12 during the read operation shown in FIG. 14.

Referring to FIG. 15, the bit line precharge operation may be performed in the same manner as for the embodiment illustrated by FIG. 13. After the bit line precharge operation has been performed, first sensing and erase cell masking operations (sensing-1 & erase cell masking) may start. During the bit line precharge operation and the first sensing and erase cell masking operations (sensing-1 & erase cell masking), a pre-read voltage may be applied to a word line. When the first sensing and erase cell masking operations (sensing-1 & erase cell masking) start, the second precharge signal SA_PRECH_N may make a transition to the power source voltage VCCI. Thus, the fourth transistor M4 may be turned off, and the electrical connection between the sense-out node SO and the power source (VCCI) node may be interrupted. As a result, the voltage of the sense-out node SO may be changed by the threshold voltage of the memory cell. In other words, during a first sense evaluation period tEVAL1, the voltage of the sense-out node SO may be changed by the threshold voltage of the memory cell. During the first sensing and erase cell masking operations (sensing-1 & erase cell masking), a pre-verify voltage may be applied to the word line. Therefore, the voltage of the sense-out node SO of the page buffer 231 coupled to the memory cells included in category A of FIG. 14 may be rapidly reduced. Furthermore, the voltage of the sense-out node SO of the page buffer 231 coupled to the memory cells included in categories B or C of FIG. 14 may be gently reduced or may not be reduced.

After the first sense evaluation period tEVAL1 has been closed, a second sensing signal SENSING_N may be activated for a predetermined time. Hence, the eleventh transistor M11 of FIG. 12 may be turned on for a predetermined time. As a result, the voltage of the Q node (Q) of the storage unit 2311 may be determined by the voltage of the sense-out node SO. In other words, the voltage of the sense-out node SO of the page buffer 231 coupled to the memory cells included in category A of FIG. 14 may turn on the twelfth transistor M12, thus changing the Q node (Q) to the high level. In addition, the voltage of the sense-out node SO of the page buffer 231 coupled to the memory cells included in categories B or C of FIG. 14 may turn off the twelfth transistor M12, thus maintaining the Q node (Q) at the low level.

After the first sensing and erase cell masking operations (sensing-1 & erase cell masking) have been completed, a bit line recovery operation may be performed. When the bit line recovery operation starts, the second precharge signal SA_PRECH_N is activated, and the fourth transistor M4 is turned on. In the case of the memory cells in categories B and C of FIG. 14 that have been determined to be off-cells during the first sensing operation, the third transistor M3 is turned on because the voltage of the Q node (Q) is at the low level when the bit line recovery operation starts. Therefore, in the case of the memory cells included in categories B and C of FIG. 14, during the bit line recovery operation, the bit line and the sense-out node are electrically connected to the power source (VCCI) node again. Unlike this, in the case of the memory cells in category A of FIG. 14 that have been determined to be on-cells during the first sensing operation, the third transistor M3 is turned off because the voltage of the Q node (Q) is at a high level when the bit line recovery operation starts. Therefore, in the case of the memory cells included in category A of FIG. 14, during the bit line recovery operation, the bit line and the sense-out node SO are electrically disconnected from a power source node, and the seventh transistor M7 is turned on, so that the bit line and the sense-out node SO are electrically connected to the ground node. As a result, in the case of the memory cells included in category A of FIG. 14, the voltage of the bit line remains at the ground voltage during the bit line recovery operation. As described above, the term "erase cell masking operation" refers to an operation of blocking current from flowing through erase cells, i.e., memory cells that have been determined to be on-cells.

During the bit line recovery operation, the voltage of the word line may be changed from the pre-read voltage to the target read voltage. Consequently, during the second sensing operation, the target read voltage may be applied to the word line.

After the bit line recovery operation has been completed, the second sensing operation (sensing-2) may start. When the second sensing operation starts, the second precharge signal SA_PRECH_N may make a transition to the power source voltage VCCI. Thus, the fourth transistor M4 may be turned off, and the electrical connection between the sense-out node SO and the power source (VCCI) node may be interrupted. As a result, the voltage of the sense-out node SO may be changed by the threshold voltage of the memory cell. In other words, during a second sense evaluation period tEVAL2, the voltage of the sense-out node SO may be changed by the threshold voltage of the memory cell. During the second sensing operation, the target read voltage may be applied to the word line. As a result, the voltage of the sense-out node SO of the page buffer 231 coupled to the memory cells included in category B of FIG. 14 may be rapidly reduced. Furthermore, the voltage of the sense-out node SO of the page buffer 231 coupled to the memory cells included in category C of FIG. 14 may be gently reduced or may not be reduced.

After the second sense evaluation period tEVAL2 has been closed, the second sensing signal SENSING_N may be activated for a predetermined time. Hence, the eleventh transistor M11 of FIG. 12 may be turned on for a predetermined time. As a result, the voltage of the Q node (Q) of the storage unit 2311 may be determined by the voltage of the sense-out node SO. In other words, the voltage of the sense-out node SO of the page buffer 231 coupled to the memory cells included in category B of FIG. 14 may turn on the twelfth transistor M12, thus changing the Q node (Q) to the high level. In addition, the voltage of the sense-out node SO of the page buffer 231 coupled to the memory cells included in category C of FIG. 14 may turn off the twelfth transistor M12, thus maintaining the Q node (Q) at the low level.

During the second sensing operation, the bit line coupled to the memory cells included in category A of FIG. 14 may remain at the ground voltage. Therefore, during the second sensing operation, current may not flow through the memory cells included in category A of FIG. 14. Thus, during the second sensing operation, source line noise may not be caused by the memory cells included in category A of FIG. 14. As a result, the accuracy of the second sensing operation may be further improved.

Figure 16:
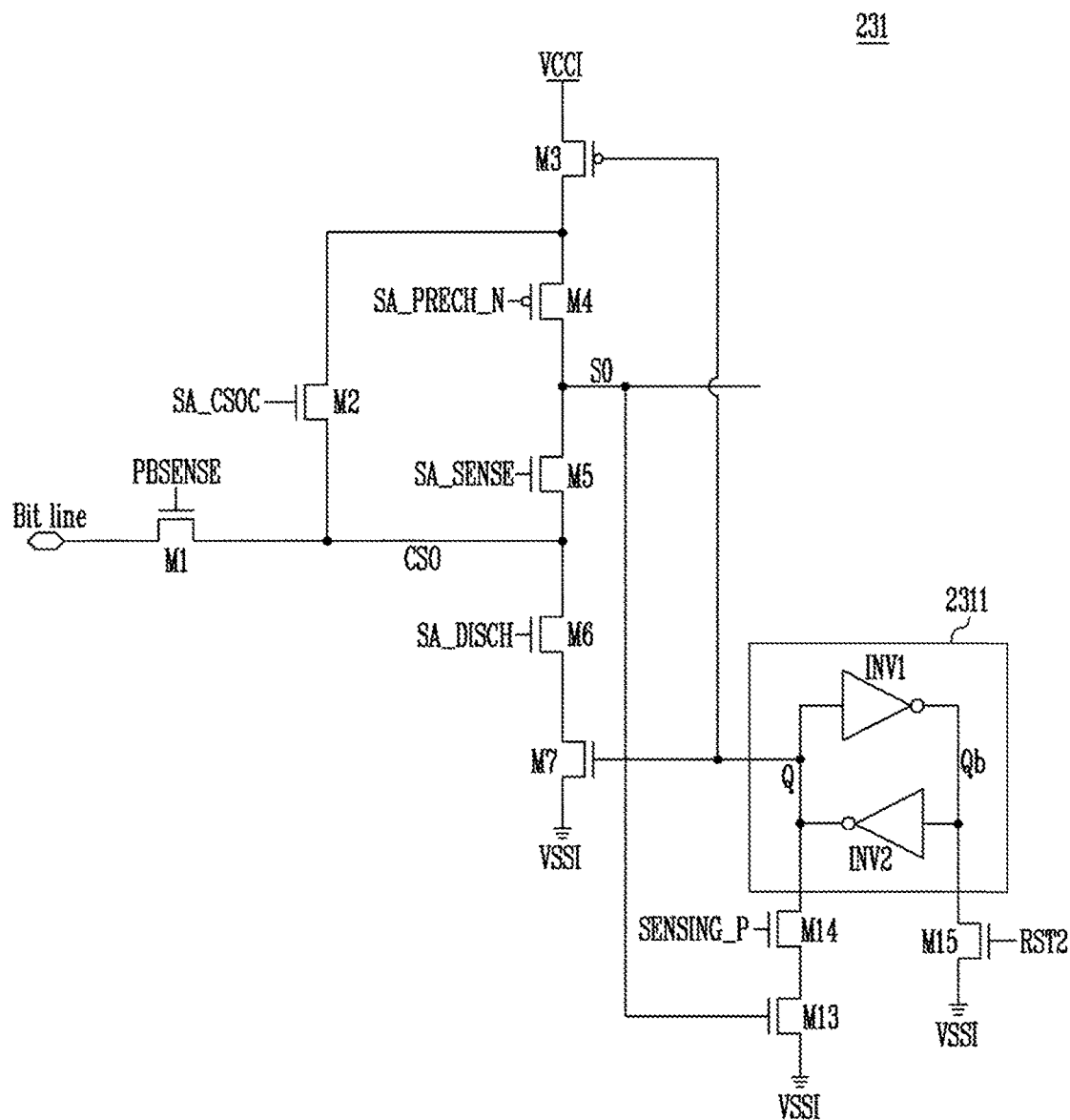
FIG. 16 is a diagram illustrating a page buffer in accordance with an embodiment of the present disclosure.
Figure 17:
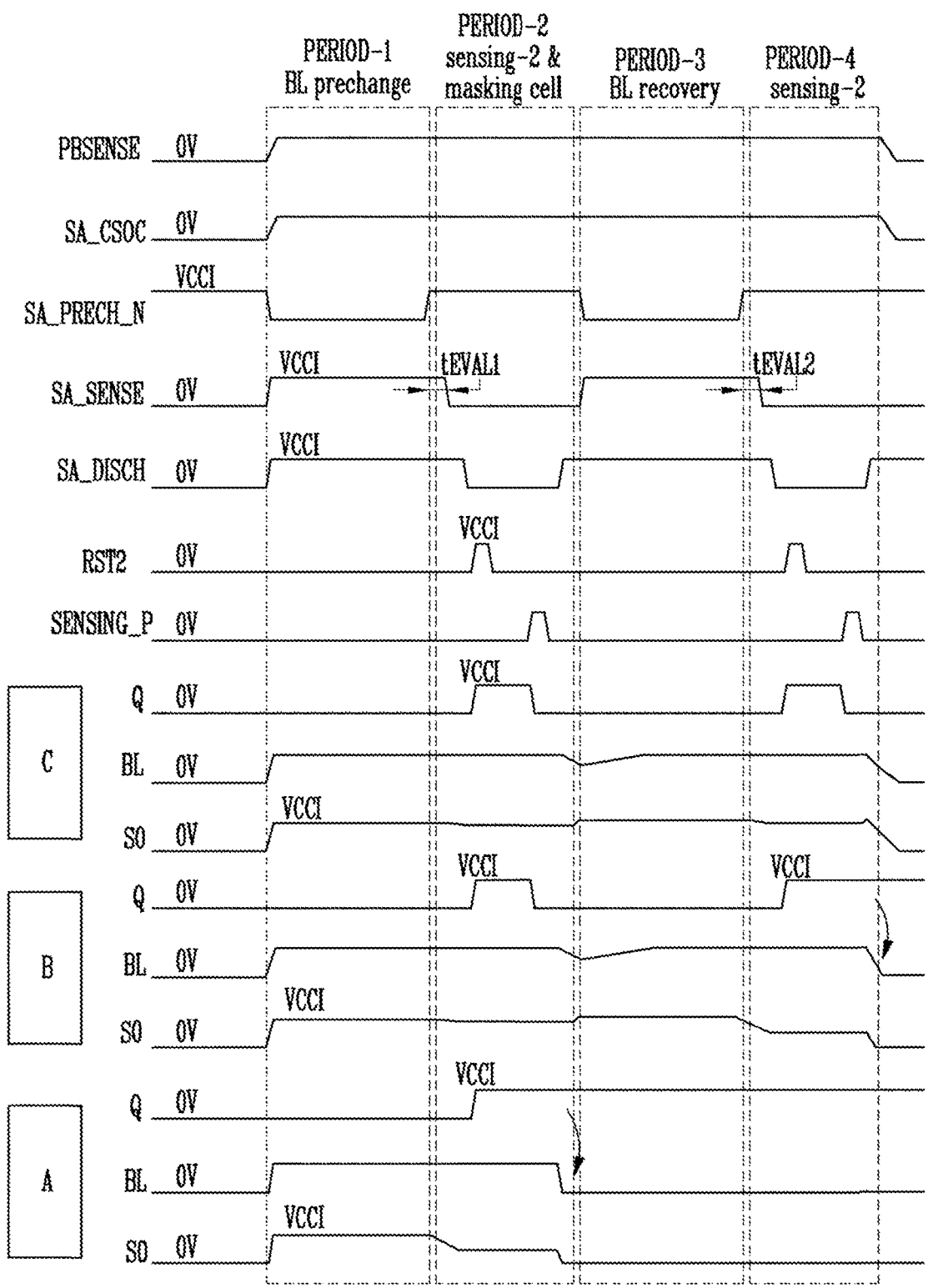
FIG. 17 is a timing diagram illustrating the operation of the page buffer of FIG. 16 during the read operation shown in FIG. 14.

FIG. 16 is a diagram illustrating the page buffer 231 in accordance with a different embodiment of the present disclosure. FIG. 17 is a timing diagram illustrating the operation of the page buffer 231 of FIG. 16 during the read operation shown in FIG. 14.

Referring to FIG. 16, the page buffer 231 may be coupled to a memory cell MC through a bit line and perform a bit line precharge operation of charging charges from a power source VCCI to the bit line through first to fifth transistors M1 to M5. The first transistor M1 may be controlled by a first sense signal PBSENSE, the second transistor M2 may be controlled by a first precharge signal SA_CSOC, and the third transistor M3 may be controlled by a storage unit 2311. The fourth transistor M4 may be controlled by a second precharge signal SA_PRECH_N, and the fifth transistor M5 may be controlled by a second sense signal SA_SENSE.

The page buffer 231 may discharge charges from the bit line to the ground VSSI through the first transistor M1, a sixth transistor M6, and a seventh transistor M7. The sixth transistor M6 may be controlled by a first discharge signal SA_DISCH, and the seventh transistor M7 may be controlled by the storage unit 2311.

The page buffer 231 may include the storage unit 2311 having a first inverter INV1 and a second inverter INV2. The storage unit 2311 may control the bit line precharge operation by turning on or off the third transistor M3 through a Q node (Q). A Q-bar node (Qb) and the Q node (Q) may have values inverted from each other. During the sensing operation on the memory cell MC, the voltage of a sense-out node SO may be determined based on the threshold voltage of the memory cell MC. The storage unit 2311 may store a result of sensing the threshold voltage of the memory cell MC through a thirteenth transistor M13 coupled to the sense-out node SO. For an embodiment, the thirteenth transistor M13 may be an N-type MOS transistor. The sense-out node SO may be coupled to a gate node of the thirteenth transistor M13. Therefore, in the case where the threshold voltage of the memory cell MC is low, during the sensing operation, the sense-out node SO may be turned to the low level, and the thirteenth transistor M13 may be turned off. In the case where the threshold voltage of the memory cell MC is high, during the sensing operation, the sense-out node SO may be turned to the high level, and the thirteenth transistor M13 may be turned on.

Referring to FIG. 17, during the bit line precharge operation, the first to seventh transistors M1 to M7 may be operated in a manner similar to those of the embodiment illustrated FIG. 11. Here, the voltage of the Q node (Q) may be set to the ground voltage.

After the bit line precharge operation has been performed, first sensing and erase cell masking operations (sensing-1 & erase cell masking) may start. During the bit line precharge operation and the first sensing operation, a pre-read voltage may be applied to a word line. When the first sensing and erase cell masking operations (sensing-1 & erase cell masking) start, the second precharge signal SA_PRECH_N may make a transition to the power source voltage VCCI. Thus, the fourth transistor M4 may be turned off, and the electrical connection between the sense-out node SO and the power source (VCCI) node may be interrupted. As a result, the voltage of the sense-out node SO may be changed by the threshold voltage of the memory cell. In other words, during a first sense evaluation period tEVAL1, the voltage of the sense-out node SO may be changed by the threshold voltage of the memory cell. For example, the voltage of the sense-out node SO of the page buffer 231 coupled to the memory cells included in category A of FIG. 14 may be rapidly reduced. Furthermore, the voltage of the sense-out node SO of the page buffer 231 coupled to the memory cells included in categories B or C of FIG. 14 may be gently reduced or may not be reduced.

After the first sense evaluation period tEVAL1 has been closed, the second sense signal SA_SENSE may be deactivated. The fifth transistor M5 may be turned off by the deactivation of the second sense signal SA_SENSE. As a result, the electrical connection between the sense-out node SO and the bit line may be interrupted. In other words, the sense-out node SO may float. That is, after the first sense evaluation period tEVAL1 has been closed, the voltage of the sense-out node SO may remain at a predetermined value regardless of the threshold voltage of the memory cell.

After the second sense signal SA_SENSE has been deactivated, the first discharge signal SA_DISCH may be deactivated for a predetermined time. As a result, the sixth transistor M6 may be turned off. While the sixth transistor M6 is turned off by the deactivation of the first discharge signal SA_DISCH, a second reset signal RST2 may be activated for a predetermined time. A fifteenth transistor M15 of FIG. 16 may be turned on by the activation of the second reset signal RST2, so that the voltage of the Q node (Q) may be turned to the high level. Even when the voltage of the Q node (Q) is turned to the high level and the seventh transistor M7 is turned on, the electrical connection between a column sense-out node CSO and the ground node remains disconnected because the sixth transistor M6 remains turned off.

After the second reset signal RST2 has been deactivated, a third sensing signal SENSING_P may be activated for a predetermined time. By the activation of the third sensing signal SENSING_P, a fourteenth transistor M14 of FIG. 16 may be turned on for a predetermined time. As a result, the voltage of the Q node (Q) of the storage unit 2311 may be determined by the voltage of the sense-out node SO. In other words, the voltage of the sense-out node SO of the page buffer 231 coupled to the memory cells included in category A of FIG. 14 may turn off the fourteenth transistor M14, thus maintaining the voltage of the Q node (Q) at the high level. In addition, the voltage of the sense-out node SO of the page buffer 231 coupled to the memory cells included in categories B or C of FIG. 14 may turn on the fourteenth transistor M14, thus changing the voltage of the Q node (Q) to the low level.

After the first sensing and erase cell masking operations (sensing-1 & erase cell masking) have been completed, a bit line recovery operation may be performed. When the bit line recovery operation starts, the second precharge signal SA_PRECH_N may be activated, and the fourth transistor M4 may be turned on. Here, in the case of the memory cells in categories B and C of FIG. 14 that have been determined to be off-cells during the first sensing operation, the third transistor M3 is turned on because the voltage of the Q node (Q) is at the low level when the bit line recovery operation starts. Therefore, in the case of the memory cells included in categories B and C of FIG. 14, during the bit line recovery operation, the bit line and the sense-out node are electrically connected to the power source (VCCI) node again. Unlike this, in the case of the memory cells in category A of FIG. 14 that have been determined to be on-cells during the first sensing operation, the third transistor M3 is turned off because the voltage of the Q node (Q) is at the high level when the bit line recovery operation starts. Therefore, in the case of the memory cells included in category A of FIG. 14, during the bit line recovery operation, the bit line and the sense-out node SO are electrically disconnected from the power source node, and the seventh transistor M7 is turned on, so that the bit line and the sense-out node SO are electrically connected to the ground node. As a result, in the case of the memory cells included in category A of FIG. 14, the voltage of the bit line remains at the ground voltage during the bit line recovery operation. In other words, as a result of the first sensing operation, the erase cell masking operation may be simultaneously performed. The term "erase cell masking operation" refers to an operation of blocking current from flowing through erase cells, i.e., memory cells that have been determined to be on-cells.

During the bit line recovery operation, the voltage of the word line may be changed from the pre-read voltage to the target read voltage. Consequently, during the second sensing operation, the target read voltage may be applied to the word line.

After the bit line recovery operation has been completed, the second sensing operation (sensing-2) may start. When the second sensing operation starts, the second precharge signal SA_PRECH_N may make a transition to the power source voltage VCCI. Thus, the fourth transistor M4 may be turned off, and the electrical connection between the sense-out node SO and the power source (VCCI) node may be interrupted. As a result, the voltage of the sense-out node SO may be changed by the threshold voltage of the memory cell. In other words, during a second sense evaluation period tEVAL2, the voltage of the sense-out node SO may be changed by the threshold voltage of the memory cell. For example, the voltage of the sense-out node SO of the page buffer 231 coupled to the memory cells included in category B of FIG. 14 may be rapidly reduced. Furthermore, the voltage of the sense-out node SO of the page buffer 231 coupled to the memory cells included in category C of FIG. 14 may be gently reduced or may not be reduced.

After the second sense evaluation period tEVAL2 has been closed, the second sense signal SA_SENSE may be deactivated. The fifth transistor M5 may be turned off by the deactivation of the second sense signal SA_SENSE. As a result, the electrical connection between the sense out node SO and the bit line may be interrupted. That is, after the first sense evaluation period tEVAL1 has been closed, the voltage of the sense-out node SO may remain at a predetermined value regardless of the threshold voltage of the memory cell. In other words, the sense-out node SO may electrically float.

After the second sense signal SA_SENSE has been deactivated, the first discharge signal SA_DISCH may be deactivated for a predetermined time. As a result, the sixth transistor M6 may be turned off. While the sixth transistor M6 is turned off by the deactivation of the first discharge signal SA_DISCH, the second reset signal RST2 may be activated for a predetermined time. The fifteenth transistor M15 of FIG. 16 may be turned on by the activation of the second reset signal RST2, so that the voltage of the Q node (Q) may be turned to the high level. Even when the voltage of the Q node (Q) is turned to the high level and the seventh transistor M7 is turned on, the electrical connection between the column sense-out node CSO and the ground node remains disconnected because the sixth transistor M6 remains turned off.

After the second reset signal RST2 has been deactivated, the third sensing signal SENSING_P may be activated for a predetermined time. The fourteenth transistor M14 of FIG. 16 may be turned on for a predetermined time by the activation of the third sensing signal SENSING_P. As a result, the voltage of the Q node (Q) of the storage unit 2311 may be determined by the voltage of the sense-out node SO. In other words, the voltage of the sense-out node SO of the page buffer 231 coupled to the memory cells included in category A of FIG. 14 may turn off the fourteenth transistor M14, thus maintaining the voltage of the Q node (Q) at the high level. In addition, the voltage of the sense-out node SO of the page buffer 231 coupled to the memory cells included in category C of FIG. 14 may turn on the fourteenth transistor M14, thus changing the Q node (Q) to the low level.

After the second sensing operation has been completed, in the case of memory cells included in categories A or B of FIG. 14, the voltage of the Q node (Q) of the storage unit 2311 may have a high value, and in the case of the memory cells included in category C of FIG. 14, the voltage of the Q node (Q) may have a low value.

During the second sensing operation, the bit line coupled to the memory cells included in category A of FIG. 14 may remain at the ground voltage. Therefore, during the second sensing operation, current may not flow through the memory cells included in category A of FIG. 14. Thus, during the second sensing operation, source line noise may not be caused by the memory cells included in category A of FIG. 14. As a result, the accuracy of the second sensing operation may be further improved.

Figure 18:
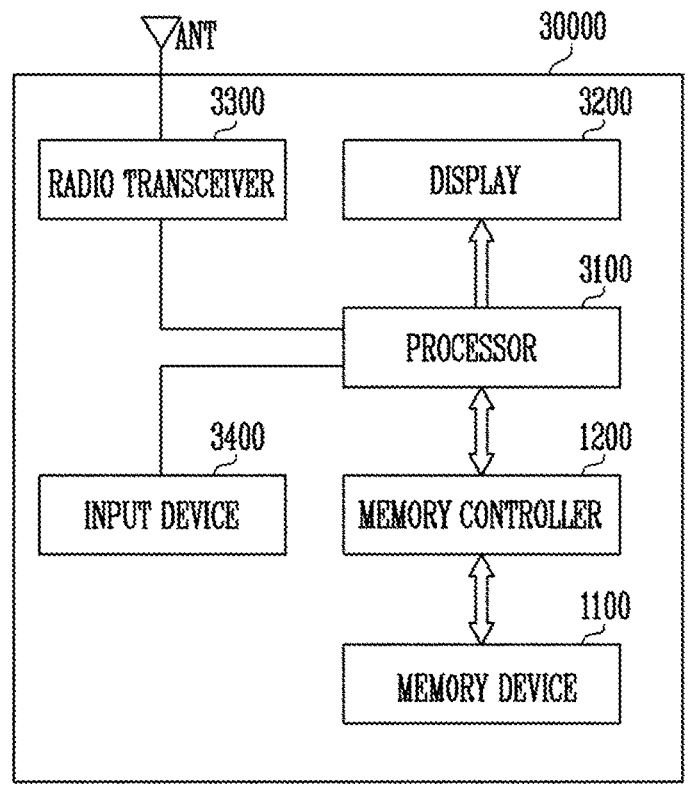
FIG. 18 is a diagram illustrating an embodiment of a memory system including the memory device shown in FIG. 2.

FIG. 18 is a diagram illustrating an embodiment of a memory system 30000 including the memory device 1100 shown in FIG. 2.

Referring to FIG. 18, the memory system 30000 may be embodied in a cellular phone, a smartphone, a tablet PC, a personal digital assistant (PDA) or a wireless communication device. The memory system 30000 may include the memory device 1100 and a memory controller 1200 configured to control the memory device 1100. The memory controller 1200 may control a data access operation, e.g., a program, erase, or read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal outputted from the radio transceiver 3300 and send the processed signal to the memory controller 1200 or the display 3200. The memory controller 1200 may program a signal processed by the processor 3100 and send the programmed signal to the memory device 1100. Furthermore, the radio transceiver 3300 may change a signal outputted from the processor 3100 into a radio signal, and transmit the changed radio signal to an external device through the antenna ANT. An input device 3400 may be used to input into the processor 3100 a control signal for controlling the operation of the processor 3100 or data to be processed by the processor 3100. The input device 3400 may be embodied by a pointing device, such as a touch pad, a computer mouse, a keypad, and/or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 is capable of controlling the operation of the memory device 1100 and may be embodied as part of the processor 3100 or as a chip provided separately from the processor 3100.

Figure 19:
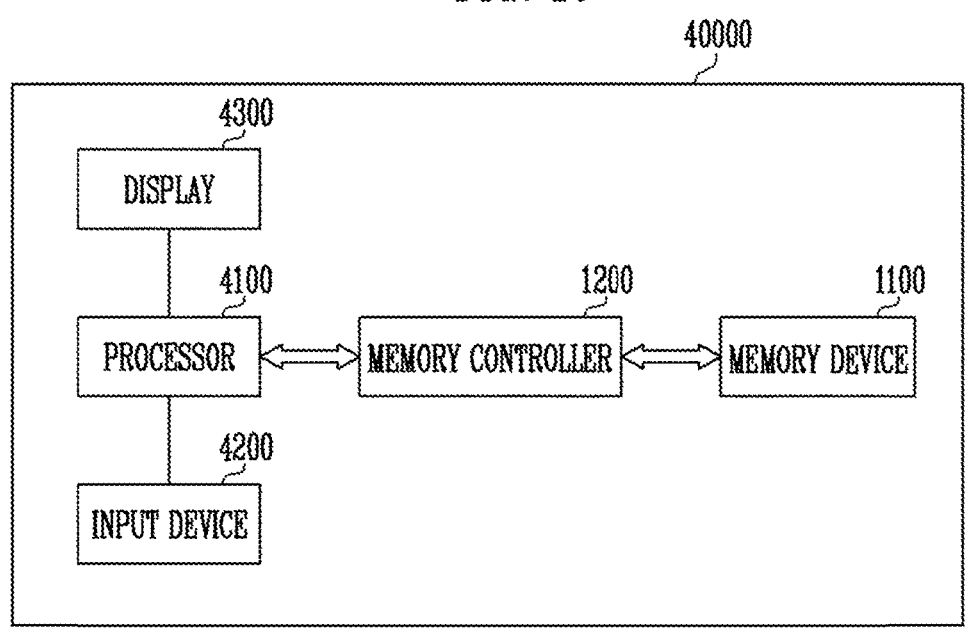
FIG. 19 is a diagram illustrating an embodiment of a memory system including the memory device shown in FIG. 2.

FIG. 19 is a diagram illustrating an embodiment of a memory system 40000, which includes the memory device 1100 shown in FIG. 2.

Referring to FIG. 19, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100 and a memory controller 1200 configured to control a data processing operation of the memory device 1100.

A processor 4100 may output data stored in the memory device 1100 through a display 4300, according to data inputted to the processor 4100 from an input device 4200. For example, the input device 4200 may be embodied by a pointing device, such as a touch pad, a computer mouse, a keypad, and/or a keyboard.

The processor 4100 may control the overall operation of the memory system 40000 and control the operation of the memory controller 1200. In an embodiment, the memory controller 1200 is capable of controlling the operation of the memory device 1100 and may be embodied as part of the processor 4100 or as a chip provided separately from the processor 4100.

Figure 20:
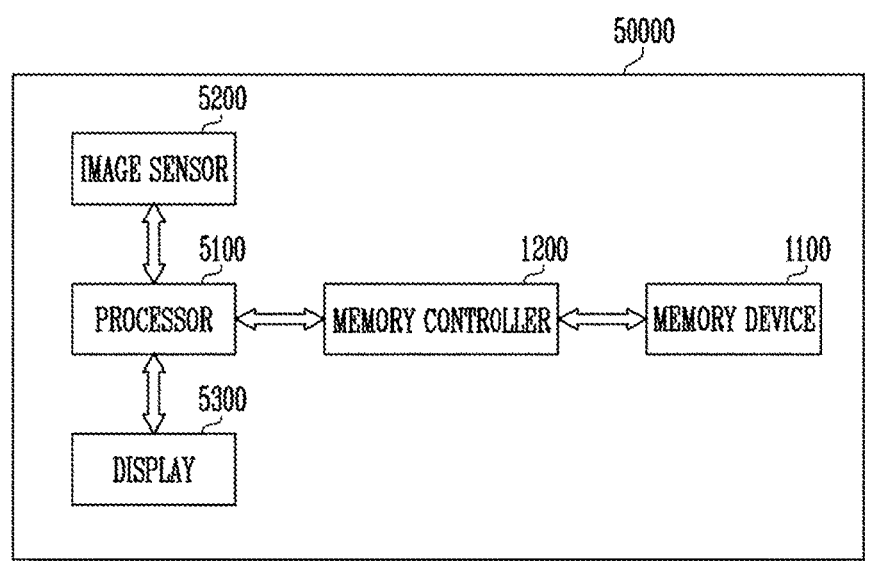
FIG. 20 is a diagram illustrating an embodiment of a memory system including the memory device shown in FIG. 2.

FIG. 20 is a diagram illustrating an embodiment of a memory system 50000, which includes the memory device 1100 shown in FIG. 2.

Referring to FIG. 20, the memory system 50000 may be embodied in an image processing device, e.g., a digital camera, a portable phone with a digital camera, a smartphone with a digital camera, or a tablet PC with a digital camera.

The memory system 50000 may include the memory device 1100, and a memory controller 1200 capable of controlling a data processing operation, e.g., a program, erase, or read operation, of the memory device 1100.

An image sensor 5200 of the memory system 50000 may convert an optical image into digital signals. The digital signals may be transmitted to a processor 5100 or the memory controller 1200. Under control of the processor 5100, the digital signals may be outputted through a display 5300 or stored in the memory device 1100 via the memory controller 1200. Data stored in the memory device 1100 may be outputted to the display 5300 under control of the processor 5100 and/or the memory controller 1200.

In an embodiment, the memory controller 1200 is capable of controlling the operation of the memory device 1100 and may be embodied as part of the processor 5100 or as a chip provided separately from the processor 5100.

Figure 21:
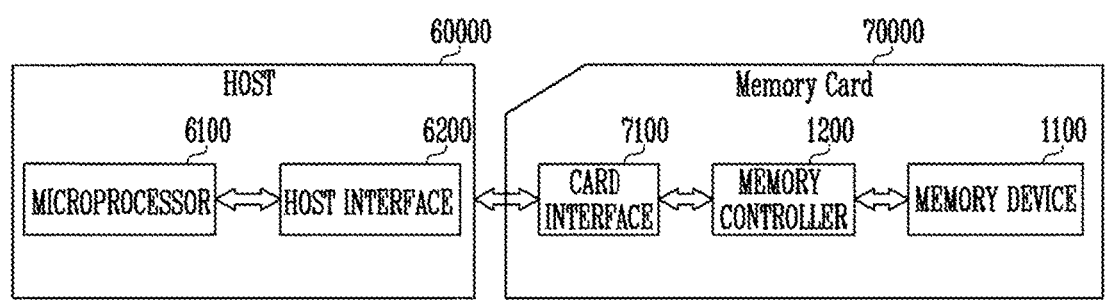
FIG. 21 is a diagram illustrating an embodiment of a memory system including the memory device shown in FIG. 2.

FIG. 21 is a diagram illustrating an embodiment of a memory system 70000, which includes the memory device 1100 shown in FIG. 2.

Referring to FIG. 21, the memory system 70000 may be embodied in a memory card or a smart card. The memory system 70000 may include the memory device 1100, a memory controller 1200 and a card interface 7100.

The memory controller 1200 may control data exchanges between the memory device 1100 and the card interface 7100. In an embodiment, the card interface 7100 may be a secure digital (SD) card interface or a multi-media card (MMC) interface, but it is not limited thereto.

The card interface 7100 may interface data exchanges between a host 60000 and the memory controller 1200 according to a protocol of the host 60000. In an embodiment, the card interface 7100 may support a universal serial bus (USB) protocol and an inter-chip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000, such as a PC, a tablet PC, a digital camera, a digital audio player, a cellular phone, console video game hardware or a digital set-top box, the host interface 6200 may perform data communications with the memory device 1100 through the card interface 7100 and the memory controller 1200 under the control of a microprocessor 6100.

Various embodiments of the present disclosure may reduce noise of a source line during a sensing operation of a memory device, thus improving the reliability of a read operation or a verify operation of the memory device.

Although specific terms are employed herein to describe presented embodiments, they are used, and are to be interpreted, in a generic and descriptive sense only and should not be construed as limiting. In some instances, as would be apparent to one of ordinary skill in the art as of the time of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and detail may be made to presented embodiments without departing from the spirit and scope of the present disclosure as set forth in the following claims.

What is claimed is:

1. A memory device comprising:
   a memory cell; and
   a page buffer coupled to the memory cell via a bit line,
   wherein the page buffer is configured to perform a read operation on the memory cell,
   wherein the page buffer comprises a storage unit configured to control a bit line precharge operation during the read operation and store a result value of a first sensing operation,
   wherein, after the bit line precharge operation, a value stored in the storage unit is inverted before the storage unit stores the result value of the first sensing operation
   wherein, the page buffer is further configured to:
   perform a bit line recovery operation after the first sensing operation, and perform a second sensing operation after the bit line recovery operation;
   wherein the storage unit is further configured to store a result value of the second sensing operation; and wherein, after the bit line recovery operation, a value stored in the storage unit is reset before the storage unit stores the result value of the second sensing operation.

2. The memory device according to claim 1, wherein, during the bit line recovery operation, a voltage of the bit line is determined based on the result value of the first sensing operation.

3. The memory device according to claim 1, further comprising:
a row decoder coupled to the memory cell via a word line, wherein the row decoder is configured to apply a first read voltage to the word line during the first sensing operation, and to apply a second read voltage to the word line during the second sensing operation, and
wherein the second read voltage is greater than the first read voltage.

4. The memory device according to claim 1, wherein the page buffer is configured to perform a bit line recovery operation after the first sensing operation, and
wherein the page buffer is configured to, when the result value of the first sensing operation is "on-cell", electrically connect the bit line to a ground node during the bit line recovery operation.

5. The memory device according to claim 1, wherein the page buffer comprises a sense node, wherein a voltage of the sense node is changed based on a threshold voltage of the memory cell, and
wherein the sense node is configured to float before the result value of the first sensing operation is stored.

6. The memory device according to claim 5, wherein the read operation includes a sense evaluation operation, and
wherein the sense node is electrically disconnected from a power source node of the memory device during the sense evaluation operation.

7. The memory device according to claim 5, wherein the storage unit comprises a first output node coupled with an N-type MOS transistor, and
wherein the sense node is coupled to a gate node of the N-type MOS transistor.

8. The memory device according to claim 7, wherein the page buffer comprises a first transistor configured to control an electrical connection between a power source node of the memory device and the bit line, and
wherein the first output node is coupled to a gate node of the first transistor.

* * * * *